(12) United States Patent
VanBuskirk et al.

(10) Patent No.: US 6,847,047 B2
(45) Date of Patent: Jan. 25, 2005

(54) METHODS THAT FACILITATE CONTROL OF MEMORY ARRAYS UTILIZING ZENER DIODE-LIKE DEVICES

(75) Inventors: Michael A. VanBuskirk, Saratoga, CA (US); Colin Bill, Cupertino, CA (US); Tzu-Ning Fang, Palo Alto, CA (US); Zhida Lan, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 11 days.

(21) Appl. No.: 10/287,363

(22) Filed: Nov. 4, 2002

(65) Prior Publication Data

US 2004/0084743 A1 May 6, 2004

(51) Int. Cl.[7] .............................................. H01L 51/00
(52) U.S. Cl. ......................................................... 257/40
(58) Field of Search ............................... 257/2, 3, 4, 5, 257/40, 529, 291, 444, 66, 369, 530, 257, 390

(56) References Cited

U.S. PATENT DOCUMENTS

| | | | |
|---|---|---|---|
| 6,236,587 B1 | * | 5/2001 | Gudesen et al. |
| 6,380,597 B1 | * | 4/2002 | Gudesen et al. |
| 6,440,837 B1 | * | 8/2002 | Harshfield |
| 6,515,888 B2 | * | 2/2003 | Johnson et al. |
| 6,525,953 B1 | * | 2/2003 | Johnson et al. |
| 6,693,821 B2 | * | 2/2004 | Hsu et al. |

* cited by examiner

Primary Examiner—Nathan J. Flynn
Assistant Examiner—Kevin Quinto
(74) Attorney, Agent, or Firm—Amin & Turocy, LLP

(57) ABSTRACT

The present invention facilitates semiconductor devices by aiding the efficiency in the way individual devices change states in a semiconductor array. State change voltages can be applied to a single device in the array of semiconductor devices without the need for transistor-type voltage controls. The diodic effect of the present invention facilitates this activity by allowing specific voltage levels necessary for state changes to only occur at the desired device. In this manner, an array of devices can be programmed with varying data or states without utilizing transistor technology. The present invention also allows for an extremely efficient method of producing these types of devices, eliminating the need to manufacture costly external voltage controlling semiconductor devices.

40 Claims, 21 Drawing Sheets

METHODS THAT FACILITATE CONTROL OF MEMORY ARRAYS UTILIZING ZENER DIODE-LIKE DEVICES

FIELD OF INVENTION

The present invention relates generally to semiconductor devices and, in particular, to semiconductor devices utilizing diodic properties.

BACKGROUND OF THE INVENTION

Semiconductors have permeated into every aspect of modern society. They are the building blocks used to create everything from the information super-highway to the electronic timer in the family toaster. Generally, any device that is used today that is considered "electronic" utilizes semiconductors. These often-unseen entities help to reduce the daily workload, increase the safety of our air traffic control systems, and even let us know when it is time to add softener to the washing machine. Modem society has come to rely on these devices in almost every product produced today. And, as we progress further into a technologically dependent society, the demand for increased device speeds, capacity and functionality drive semiconductor manufacturers to push the edge of technology even further.

A substantial amount of the semiconductors produced today are slated for the computer industry either as internal components or display components. Often, what we associate as "computer related" devices are used separately in products found in every day use. Flat panel screens are found in TV sets, handheld games, and even refrigerators. Computer chips are found in toasters, cars and cell phones. All of these common devices are possible due to the semiconductor. As the demand for more enhanced products increases, manufacturers must produce higher quality and, at the same time, cheaper semiconductor devices.

A growing area of manufacturing concentration has been on those components which can provide a building block for higher-level applications. These may include such components as memory, light emitting diodes (LEDs) and other semiconductor cells. Memory cells, for example, are used to store information. This simple device is found in some of the world's fastest computers and the most sophisticated electronics. Being able to store information, allows society to reuse data repeatedly. At the start of the electronic revolution, only a few bits of information could be stored. Today, we coin new words, such as gigabyte and terabyte, to describe the magnitude of the amount of information that can be stored, beyond most people's imaginations. This push towards larger and faster information storage and retrieval requires that semiconductors must be continuously improved to keep up with demand. LEDs have likewise pervaded our society as memory semiconductors have. They are used in displays, signs and signaling devices. They also continue to be revised, improved and advanced to keep in pace with our growing appetite for technology.

Although semiconductors (such as EEPROMs) have traditionally been based on inorganic materials during the fabrication processes, organic materials have begun to spread into the semiconductor manufacturing facilities. Organics offer the ability to produce more efficient and enhanced semiconductor devices. Organic semiconductor material (OSM) devices are being produced as a means to extend the production capabilities of present facilities. Devices that were thought to be reaching their molecular limitations as their sizes diminished, are finding new life through the use of OSM. Because of this renewing manufacturing effect, great emphasis has been placed on developing better OSM technology.

This trend in semiconductor devices has pushed organic entities such as OSM memory and organic LEDs (OLEDs) to become the new standards in semiconductor manufacturing over their former inorganic counterparts. Utilizing organic materials allows for smaller and faster semiconductor devices. But, it also creates a demand for better manufacturing methods in order to maintain quality and product yield. OSM devices are allowing the next generation of semiconductor products to advance forward and, at the same time, simplifying the manufacturing process. As OSM devices advance forward, so too must the semiconductors used to control these new OSM devices. Transistors are commonly used to provide this control. Despite being a revolutionary breakthrough when invented, the transistor is not always the ideal solution when simpler technology is the better solution. It is likely that great strides can be made in the semiconductor evolution as further progressions are made in this area.

Generally, the control of a semiconductor device is accomplished through the utilization of electricity. A voltage is placed across the device to put it in a predetermined state, thus "controlling" it. Depending on the device being subjected to the voltage, it may store a value represented by the state or it may turn the device ON or OFF. If the device is a memory cell, it may be programmed to read, write or erase based on the voltage level and polarity. If the device is an LED, application of the voltage may turn the emitter ON or OFF, reduce its brightness or increase its brightness. Thus, it is imperative for proper operation of these types of devices that there is a means to control the application and level of the voltages across them. Current manufacturing techniques utilize additional external semiconductor devices for this purpose, such as transistors. These transistors are somewhat complex devices that require a multitude of fabrication steps to produce.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention relates generally to semiconductor devices and, in particular, to semiconductor devices having diodic properties. By constructing a semiconductor device with diodic properties, the device can be manipulated without requiring external voltage controlling entities such as for example via transistors, thereby simplifying production of such devices and mitigating related production costs.

The present invention facilitates semiconductor devices by aiding the efficiency in the way individual devices change states in a semiconductor array. State change voltages can be applied to a single device in the array of semiconductor devices without the need for transistor-type voltage controls. The diodic effect of the present invention facilitates this activity by allowing specific voltage levels necessary for state changes to only occur at the desired device. In this manner, an array of devices can be programmed with varying data or states without utilizing transistor technology. The present invention also allows for an extremely efficient method of producing these types of devices, eliminating the need to manufacture costly external voltage controlling semiconductor devices.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
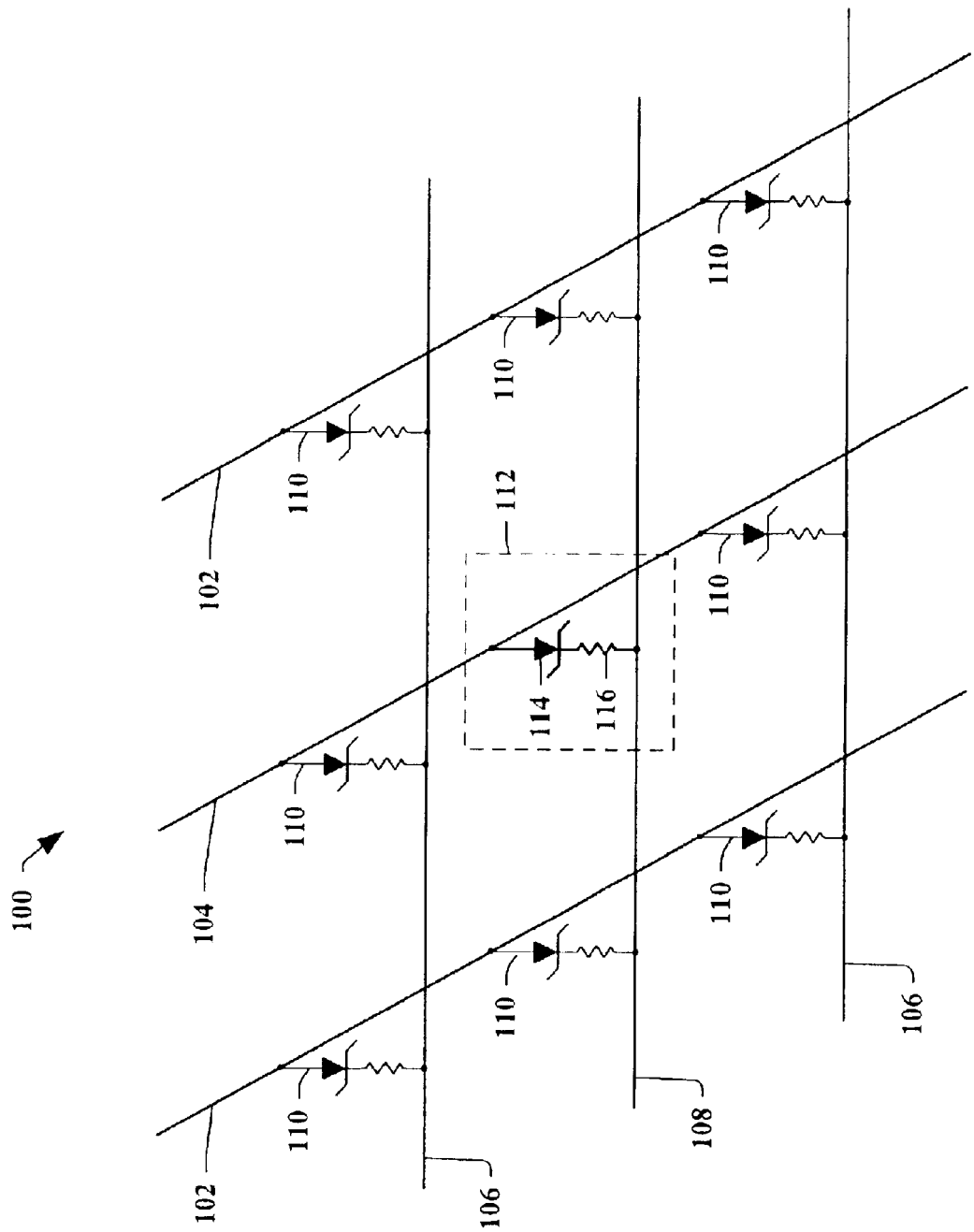
FIG. 1 is a diagram of a diodic device array in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the term "computer component" is intended to refer to a computer-related entity, either hardware, a combination of hardware and software, software, or software in execution. For example, a computer component may be, but is not limited to being, a process running on a processor, a processor, an object, an executable, a thread of execution, a program, and/or a computer. By way of illustration, both an application running on a server and the server can be a computer component. One or more computer components may reside within a process and/or thread of execution and a component may be localized on one computer and/or distributed between two or more computers.

The present invention provides a semiconductor device that allows control of its semiconductor cell via a diodic layer. This is accomplished by fabricating the device with the diodic layer coupled to the semiconductor cell. The diodic layer functions electrically as a diode to control the amount of current flowing through the cell when a voltage is applied across the semiconductor device. This layer can have characteristics similar to a zener-type diode. In a zener diode, a breakdown voltage level can be inherently predetermined by the composition of the diode. This breakdown voltage value is chosen to allow a specific operational function to result in the organic device. This function can include such things as reading, writing or erasing a semiconductor cell such as a memory cell. The present invention can also be applied to electrically erasable programmable read-only memory (EEPROMs) cells and arrays. Furthermore, it's functionality can also include turning an OLED ON or OFF or controlling its emission levels. By utilizing a coupled diodic layer, the present invention negates the requirement of using transistors to control the semiconductor cell. Since the diodic layer is less complicated to produce, the present invention reduces production costs, speeds up processes and increases product quality.

Referring to FIG. 1, a diagram of a diodic semiconductor device array 100 in accordance with an aspect of the present invention is shown. The array 100 is comprised of semiconductor diodic devices 110, 112 that are electrically connected between upper interconnects 102, 104 and lower interconnects 106, 108. The diodic semiconductor devices 110, 112 comprise a diodic layer 114 (represented by a zener diode symbol) and a semiconductor cell 116 (represented by a resistive load symbol). In one instance of the present invention, the diodic semiconductor devices 110, 112 are memory devices (organic and/or inorganic including EEPROMs and the like). They could, however, comprise OLEDs and other organic and inorganic devices. When the array is a memory device, the upper interconnects 102, 104 can be bitlines and the lower interconnects 106, 108 can be wordlines. The diodic semiconductor devices 110, 112 are then comprised of a diodic layer 114 and a semiconductor cell 116 that is a memory cell. The diodic layer 114 can have characteristics of a zener-type diode, a Schottky-type diode, and/or a normal p-n type diode and the like.

When a diodic semiconductor device (shown with a dashed outline) 112 needs to be programmed appropriately (erased, read or written), the appropriate upper interconnect (bitline) 104 and lower interconnect (wordline) 108 are raised and/or lowered to a suitable voltage level. The characteristics of the diodic layer 114 allow only the appropriate semiconductor device 112 to be programmed (state changed). The diodic layer also facilitates the programming (writing) of memory cells by acting as a resistive loading element. The appropriate voltages required to obtain a desired state is discussed in more detail infra.

Figure 2:
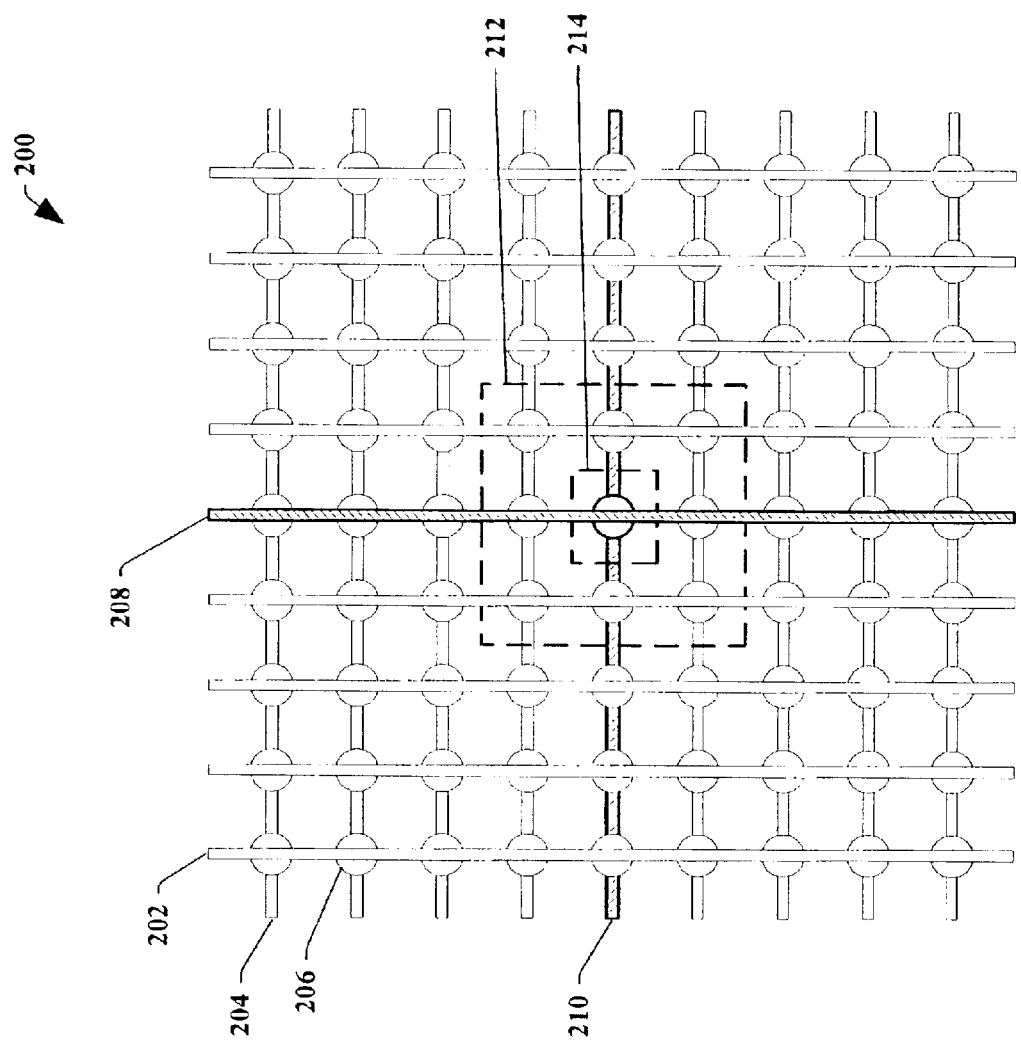
FIG. 2 is another diagram of a diodic device array in accordance with an aspect of the present invention.

Turning now to FIG. 2, another diagram of a diodic semiconductor device array 200 in accordance with an aspect of the present invention is depicted. This array 200 (oriented from a topical view) shows that the array from FIG. 1 can be part of a larger array structure. The array 200 comprises a plurality of bitlines 202, 208, wordlines 204, 210 and diodic semiconductor memory devices 206. The smaller array 212 depicted in FIG. 1 is shown enclosed in a dashed box in the center of this array 200. In this instance of the present invention, an semiconductor memory device 214 has been chosen to be programmed. The appropriate bitline 208 and wordline 210 that intersect the semiconductor memory device 214 are energized to an appropriate voltage level necessary for the desired function (e.g. read, write, erase). All devices along the appropriate bitline 208 and wordline 210 are affected by the change in voltage levels. However, only the device 214 at the intersection of the appropriate bitline 208 and wordline 210 actually changes to the appropriate state. It is the combination of the two voltage level changes that alters the device 214 state. The bitline voltage level alone and the wordline voltage level alone are not enough to program the other devices connected to these lines. Only the device 214 that is connected to both lines will surpass the threshold voltage levels set by the diodic nature of the present invention. Additionally, it is also pertinent that the remaining bitlines and wordlines are set such that the remaining memory cells are undisturbed during the processes.

Figure 3:
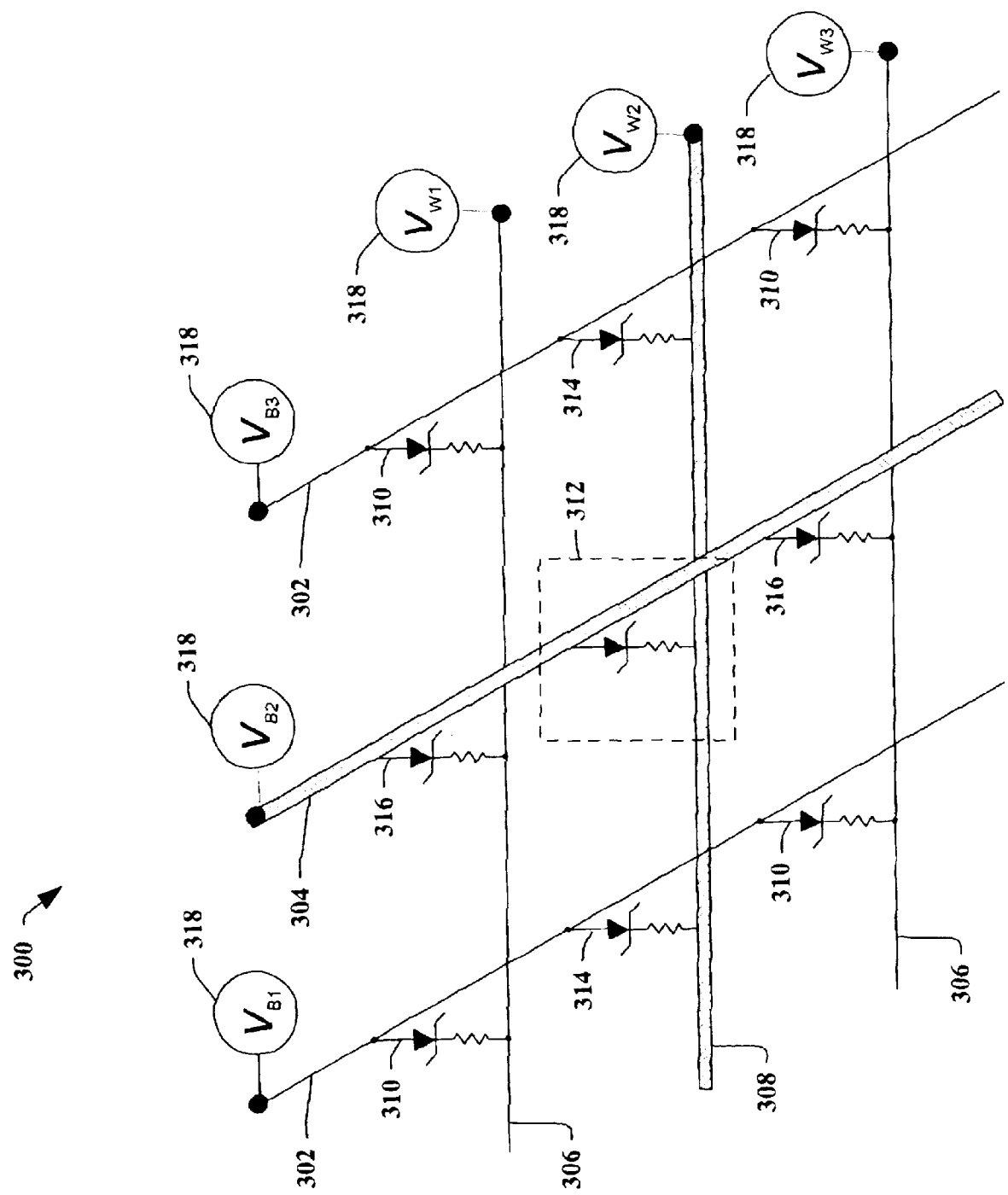
FIG. 3 is yet another diagram of a diodic device array in accordance with an aspect of the present invention.

Moving on to FIG. 3, yet another diagram of a diodic semiconductor device array 300 in accordance with an aspect of the present invention is illustrated. As discussed supra for FIG. 1, a similar array 300 is depicted that also includes voltage sources 318 for bitlines 302, 304 and wordlines 306, 308. For this instance of the present invention, a desired memory cell 312 is being programmed. It is connected to a desired bitline 304 and a desired wordline 308. No other cell 310, 314, 316 in the array 300 is connected to both of these lines. However, there are other wordline cells 314 connected to the same desired wordline 308 and other bitline cells 316 connected to the same desired bitline 304. Cells 310 that are not connected to either the desired bitline 304 or the desired wordline 308 are unaffected by the programming of the desired cell 312.

To better illustrate how the present invention facilitates the programming of a memory cell, typical working voltages will be used to demonstrate the effects on the array 300. One skilled in the art can appreciate that other values can be used without altering the scope of the present invention. Assuming that the cells in the array 300 have been fabricated with zener-type characteristics (discussed in more detail infra) and have a breakdown voltage of approximately 4 volts, the following relationships hold true (with a theoretically perfect diode having no potential drop across it).

To write the desired cell 312, the following voltages are applied from the appropriate voltage sources: $V_{W1}=V_{W3}=1.0$ volts, $V_{W2}=0.0$ volts, $V_{B2}=1.0$ volts, $V_{B1}=V_{B3}=0.0$ volts. These voltage levels produce a 1.0 volt level across the desired cell 312, causing it to be programmed (written). The bitline cells 316 and wordline cells 314 are forced to 0.0 volts. The remaining cells 310 in the array 300 have a −1.0 volt drop across them.

To erase the desired cell 312, the following voltages are applied from the appropriate voltage sources: $V_{W1}=V_{W3}=2.0$ volts, $V_{W2}=4.0$ volts, $V_{B2}=0.0$ volts, $V_{B1}=V_{B3}=2.0$ volts. These voltage levels produce a −4.0 volt level across the desired cell 312, causing it to be erased. The bitline cells 316 and wordline cells 314 are forced to −2.0 volts. The remaining cells 310 in the array 300 have a 0.0 volt drop across them.

To read the desired cell 312, the following voltages are applied from the appropriate voltage sources: $V_{W1}=V_{W3}=0.5$ volts, $V_{W2}=+V_{sen}$ volts ($V_{sen}$ is the sense voltage and is ideally equal to zero volts. However, under actual conditions, the value is usually not exactly zero, but approximately zero.), $V_{B2}=0.5$ volts, $V_{B1}=V_{B3}=0.0$ volts. These voltage levels produce a 0.5 volt level across the desired cell 312, allowing it to be read. The bitline cells 316 are forced to 0.0 volts, and the wordline cells 314 are forced to $-V_{sen}$ volts. The remaining cells 310 in the array 300 have a −0.5 volt drop across them.

The basic relationships required for utilizing this type of arrangement is as follows:

$$|V_{ERASE}|>|V_{PROG}|>|V_{READ}| \tag{A}$$

$$|V_{REVERSE\ BREAKDOWN}|>|V_{FOWARD\ TURN\ ON}| \tag{B}$$

where $V_{ERASE}$ is the voltage level required to erase the memory cell, $V_{PROG}$ is the voltage level required to program (write) the memory cell and $V_{READ}$ is the voltage level required to read the memory cell. $V_{REVERSE\ BREAKDOWN}$ is the reverse voltage level at which the zener-type diode breaks down and allows current to flow in the reverse direction. $V_{FORWARD\ TURN\ ON}$ is the forward voltage level required to turn the diode on to allow current to flow in the forward direction. These relationships are based on the absolute values of these voltage levels.

The values given supra are meant to demonstrate the relationships and are not considered to be the only values or levels appropriate for the present invention. The above example also excludes the actual potential drop across the diodic layer of the present invention. A typical value for a zener-type diode would be approximately 0.6 volts for $V_{FORWARD\ TURN\ ON}$. This would require that if the desired memory cell needed 1.0 volts to be programmed (written), the applied voltages would need to be increased to 1.6 volts. This allows for the diodic layer drop of approximately 0.6 volts and still furnishes 1.0 volts across the desired memory cell. Appropriate adjustments in the read and erase function voltages would also be required.

Figure 4:
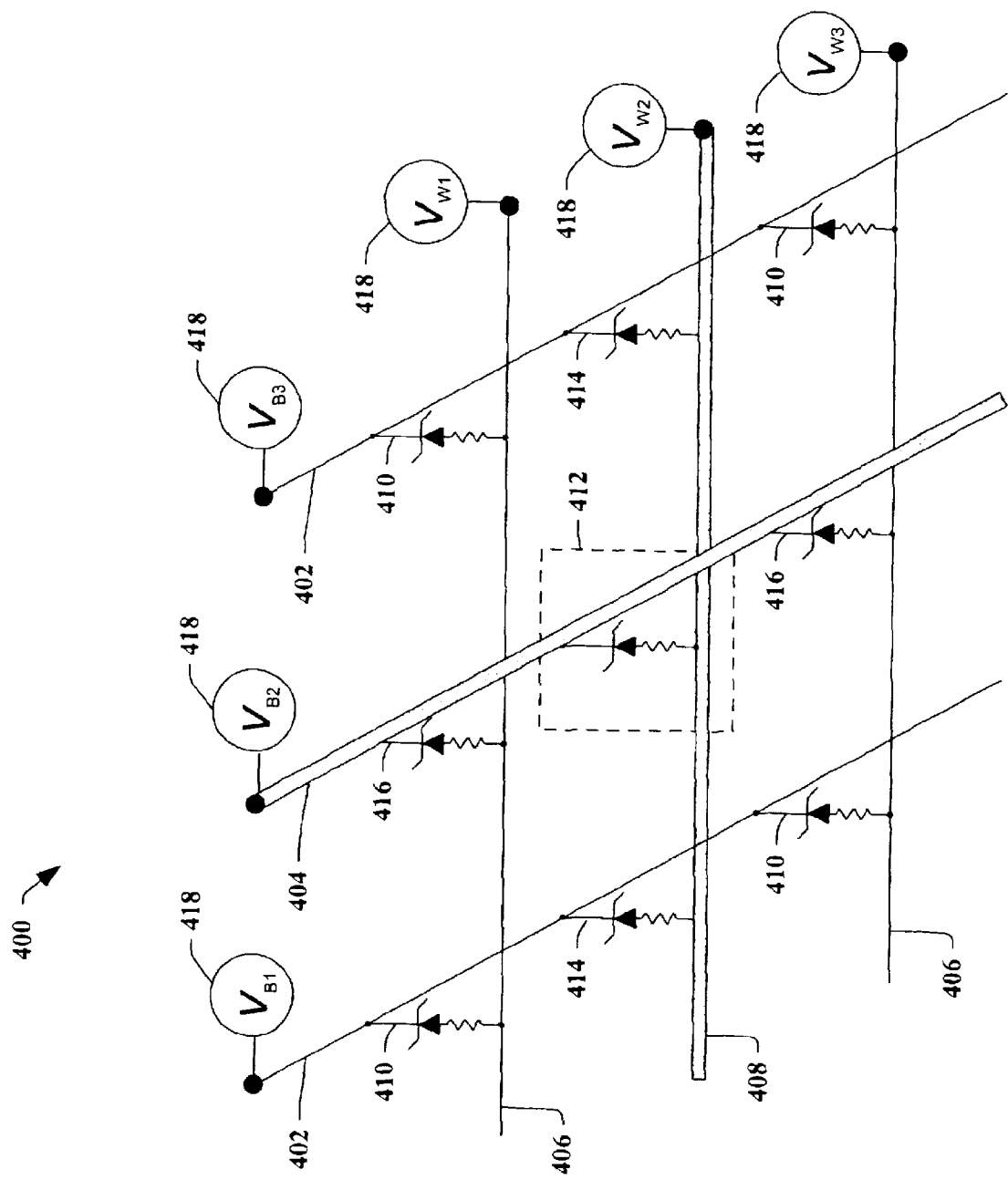
FIG. 4 is a diagram of a reverse diodic device array in accordance with an aspect of the present invention.

Referring to FIG. 4, a diagram of a reverse diodic semiconductor device array 400 in accordance with an aspect of the present invention is shown. In this array 400, the zener-type diodic layer properties are reversed. To illustrate how the present invention facilitates the programming of this type of a memory cell, typical working voltages will be used to demonstrate the effects on the array 400. One skilled in the art can appreciate that other values can be used without altering the scope of the present invention. Assuming that the cells in the array 400 have been fabricated with zener-type characteristics (discussed in more detail infra) and have a breakdown voltage of approximately −4.0 volts, the following relationships hold true (with a theoretically perfect diode having no potential drop across it).

To write the desired cell 412, the following voltages are applied from the appropriate voltage sources: $V_{W1}=V_{W3}=2.0$ volts, $V_{W2}=0.0$ volts, $V_{B2}=4.0$ volts, $V_{B1}=V_{B3}=2.0$ volts. These voltage levels produce a −4.0 volt level across the desired cell 412, causing it to be programmed (written). The bitline cells 416 and wordline cells 414 are forced to −2.0 volts. The remaining cells 410 in the array 400 have a 0.0 volt drop across them.

To erase the desired cell 412, the following voltages are applied from the appropriate voltage sources: $V_{W1}=V_{W3}=0.0$ volts, $V_{W2}=1.0$ volt, $V_{B2}=0.0$ volts, $V_{B1}=V_{B3}=1.0$ volt. These voltage levels produce a 1.0 volt level across the desired cell 412, causing it to be erased. The bitline cells 416 and wordline cells 414 are forced to 0.0 volts. The remaining cells 410 in the array 400 have a −1.0 volt drop across them.

The basic relationships required for utilizing this type of arrangement is as follows:

$$|V_{PROG}|>|V_{ERASE}|>|V_{READ}| \qquad (C)$$

where $V_{PROG}$ is the voltage level required to program (write) the memory cell, $V_{ERASE}$ is the voltage level required to erase the memory cell and $V_{READ}$ is the voltage level required to read the memory cell. The relationship is based on the absolute values of these voltage levels.

The values given supra are meant to demonstrate the relationships and are not considered to be the only values or levels appropriate for the present invention. The above example also excludes the actual potential drop across the diodic layer of the present invention. A typical value for a zener-type diode would be approximately 0.6 volts for $V_{FORWARD\ TURN\ ON}$. Appropriate adjustments in the read and erase function voltages would also be required.

Figure 5:
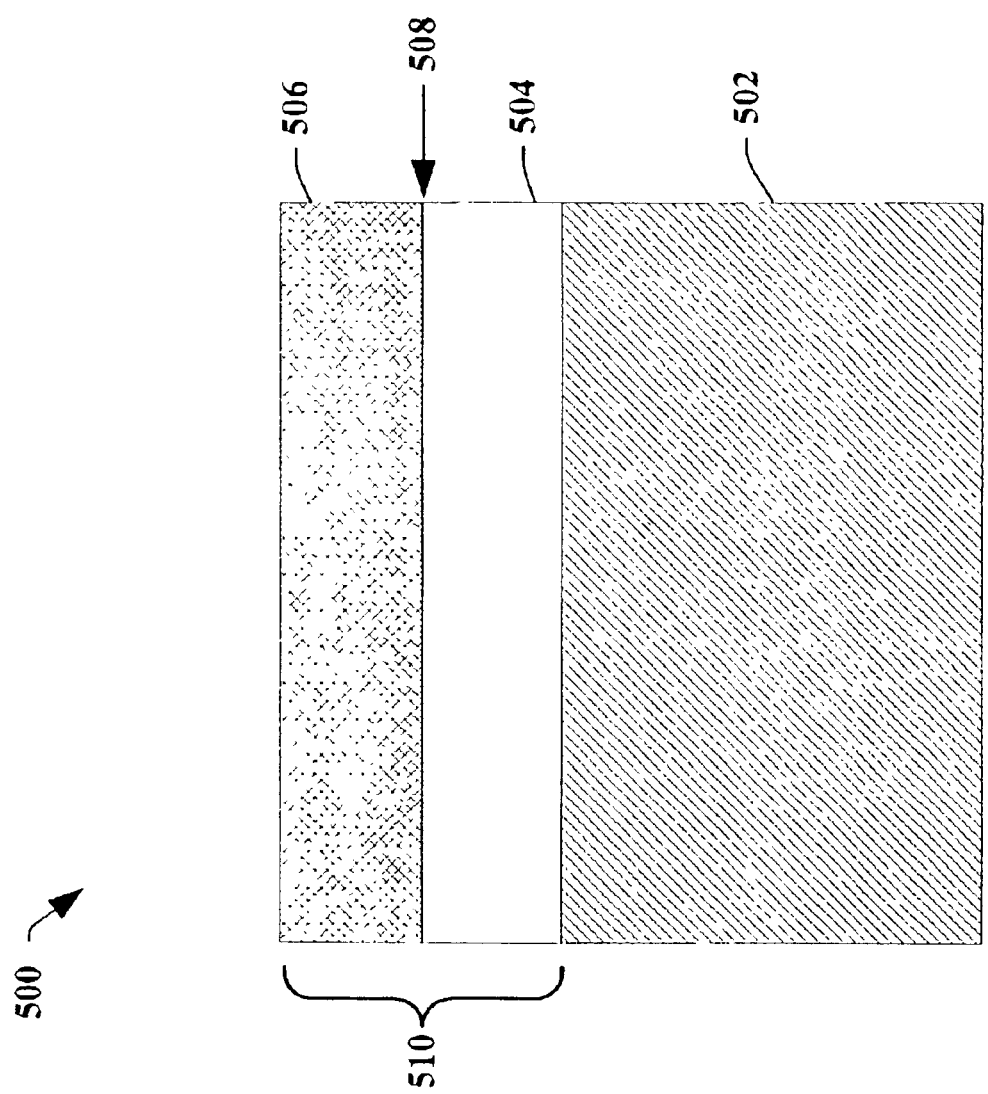
FIG. 5 is a diagram of a diodic device in accordance with an aspect of the present invention.

Moving on to FIG. 5, a diagram of a diodic semiconductor device 500 in accordance with an aspect of the present invention is depicted. The diodic semiconductor device 500 includes a diodic layer 510 coupled to at least one semiconductor cell 502. The diodic layer 510 comprises a first layer 504 and a second layer 506. A diodic junction 508 is created between the first and second layers 504, 506 due to a difference in work function between the materials of the two layers and/or due to a charge exchange between the two layers.

The first and second layers 504, 506 can be deposited on the semiconductor cell 502 in any manner that maintains the diodic junction 508. This can include chemical vapor deposition (CVD) processes such as atmospheric pressure CVD (APCVD), low pressure CVD (LPCVD), plasma-enhanced CVD (PECVD), photochemical (ultraviolet) (LPCVD), vapor phase epitaxy (VPE), and metalorganic CVD (MOCVD). Additional non-CVD methods such as molecular beam epitaxy (MBE) are also acceptable.

The first layer 504 is comprised of a material that produces a desired diodic junction 508 for a given aspect of the present invention. The first layer 504 works in conjunction with the second layer 506 and, therefore, its composition must be paired appropriately with the second layer 506 composition. The first layer 504 can be a thin or multi-thin film layer. Its composition can be polysilicon, organic and inorganic conductor, crystal state semiconductor, and amorphous state semiconductor material and the like.

The second layer 506 is comprised of materials necessary to form the required diodic junction 508 with the first layer 504. The desired junction can be a silicon based p-n junction, an organic semi conductor based junction, a metal based organic semiconductor junction, and a silicon p- or n-type based organic semiconductor junction and the like. To one skilled in the art, it is obvious that the composition of the second layer 506 can be any number of appropriate materials that when forming a junction with the first layer 504 achieves the desired diodic characteristics.

Selecting materials with the appropriate work function differences and/or charge characteristics can alter the diodic effect produced by the two layers 504, 506. Work function is the energy needed to move electrons in the solid atom from the Fermi level to vacuum level (outside of the atom). The work function difference is the characteristics of the contact between the two materials that have differing work functions, defining ohmic or rectifying contact.

In one aspect of the present invention, the second layer 506 is comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys. The thickness of the second layer 506 can vary depending on the implementation and the semiconductor device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The diodic layer 510 controls the amount of current that flows through the semiconductor cell 502 when a voltage is applied across the diodic semiconductor device 500. The diode characteristics of the diodic layer 508 determine how much voltage is required to produce a given amount of current through the semiconductor cell 502. One skilled in the art can appreciate that there are a wide range of different types of diodes (including Schottky diodes and the like) that provide numerous differing diode characteristics, allowing an almost infinite capability to fine tune the desired controlling effect.

It is helpful to understand the basics of how diodes operate to fully appreciate the present invention. A diode is essentially a two-region device separated by a junction. It either allows current to pass or prohibits it. Whether the current is allowed to pass, is determined by the voltage level and polarity, referred to as biasing. Generally, when the polarity of the applied voltage matches the polarity of the diode region at the junction, the diode is considered to be forward biased, permitting the current to flow. When the polarities are opposing, the diode is considered to be reverse biased, inhibiting the current flow. Current flow in a reverse biased diode can be achieved by raising the applied voltage to a level that forces the junction into breakdown. Generally, reaching this condition in a normal diode will damage it due to the generation of heat caused by the increased current. For zener-type diodes, however, breakdown is not a damaging condition and the current flow will once again stop when the applied voltage level is reduced below the level required to cause breakdown.

In general, the relationship between the current and voltage can be expressed using the ideal diode equation:

$$I_D = I_S \left( e^{\frac{qV_D}{nkT}} - 1 \right)$$

where $I_D$ is the current through the diode and $V_D$ is the voltage across the diode. Additionally, $I_S$ is the reverse saturation current (the current that flows through the diode when it is reverse biased $-V_D$ is negative), q is the electronic charge (1.602×10$^{-19}$C), k is Boltzmann's constant (1.38× 10$^{-23}$ J/°K), T=junction temperature in Kelvins, and n is the emission coefficient.

Zener diodes are designed to pass a current in the reverse direction when the voltage across it reaches a certain (negative) value, called the Zener voltage ($V_Z$). For diode voltages $V_D > -V_Z$, the Zener diode behaves like a normal diode. However, when $V_D = -V_Z$, the diode allows current to flow in the breakdown condition and keeps the voltage $V_D$ nearly constant at the value $-V_Z$. In this way, the Zener diode can act as a voltage regulator.

Although a reverse biased diode is ideally non conducting, a small current still flows through the semiconductor junction when the voltage is applied due to the presence of minority carriers. The total reverse current can be approximated by:

$$J_S = q \sqrt{\frac{D_p}{\tau_p}} \frac{n_i^2}{N_D} + \frac{qn_i W}{\tau_n}$$

where $D_p$ is the hole diffusion coefficient, $\tau_p$ and $\tau_n$ are the effective lifetime constants of the holes and the electrons in a depletion region. The reverse current is the sum of the diffusion component in the neutral region and the generation current in the depletion region. The diffusion current is due to the change in concentration of the charges through the material. The second term comes from the emission of charges through the deep levels present within an energy band gap. Additionally, W is the width of the depletion region, $n_i$ is the intrinsic density and $N_D$ is the donor density.

The work functions of the two materials used to form a diodic junction determine the potential barrier formed at the junction. The work function is defined as the energy difference between the vacuum level and the Fermi level, $E_F$. As an example, assume a metal layer and an n-type semiconductor layer are used to form the diodic layer of the present invention. Therefore, the work function of the metal layer is denoted by $q\phi_m$ and the semiconductor layer is denoted $q(\chi + V_n)$, where $\chi$, the electron affinity of the semiconductor, is the difference in energy between the bottom of the conduction band, $E_C$, and the vacuum level. Additionally, $qV_n$ is the difference between $E_C$ and the Fermi level.

When the metal and the semiconductor layers are in contact, a charge will low from the semiconductor to the metal. The semiconductor is n-type, so its work function is smaller than the metal work function. As the distance between the two layers decreases, an increasing negative charge is built up at the metal surface. An equal and opposite charge exists in the semiconductor. When the distance between the layers is comparable with the interatomic distance, the gap becomes transparent to electrons. The limiting value for the barrier height $q\phi_{Bn}$ is given by:

$$q\phi_{Bn} = q(\phi_m - \chi).$$

The barrier height is then the difference between the metal work function and the electron affinity of the semiconductor.

The supra formulas are meant to give a basic understanding of the formulas utilized for determining various attributes of a diodic layer. They are not meant to be the only equations that can be used to determine the characteristics necessary for an aspect of the present invention. One skilled in the art can appreciate the simplistic nature represented here and acknowledge that more complex formulas can be performed to determine higher-level diodic properties. The charge carrier and barrier potentials of p-n type diodic layers are discussed infra. This type of junction is commonly found in diodes and is discussed here as an example of how a diode works, not as the only means of the present invention.

Figure 6:
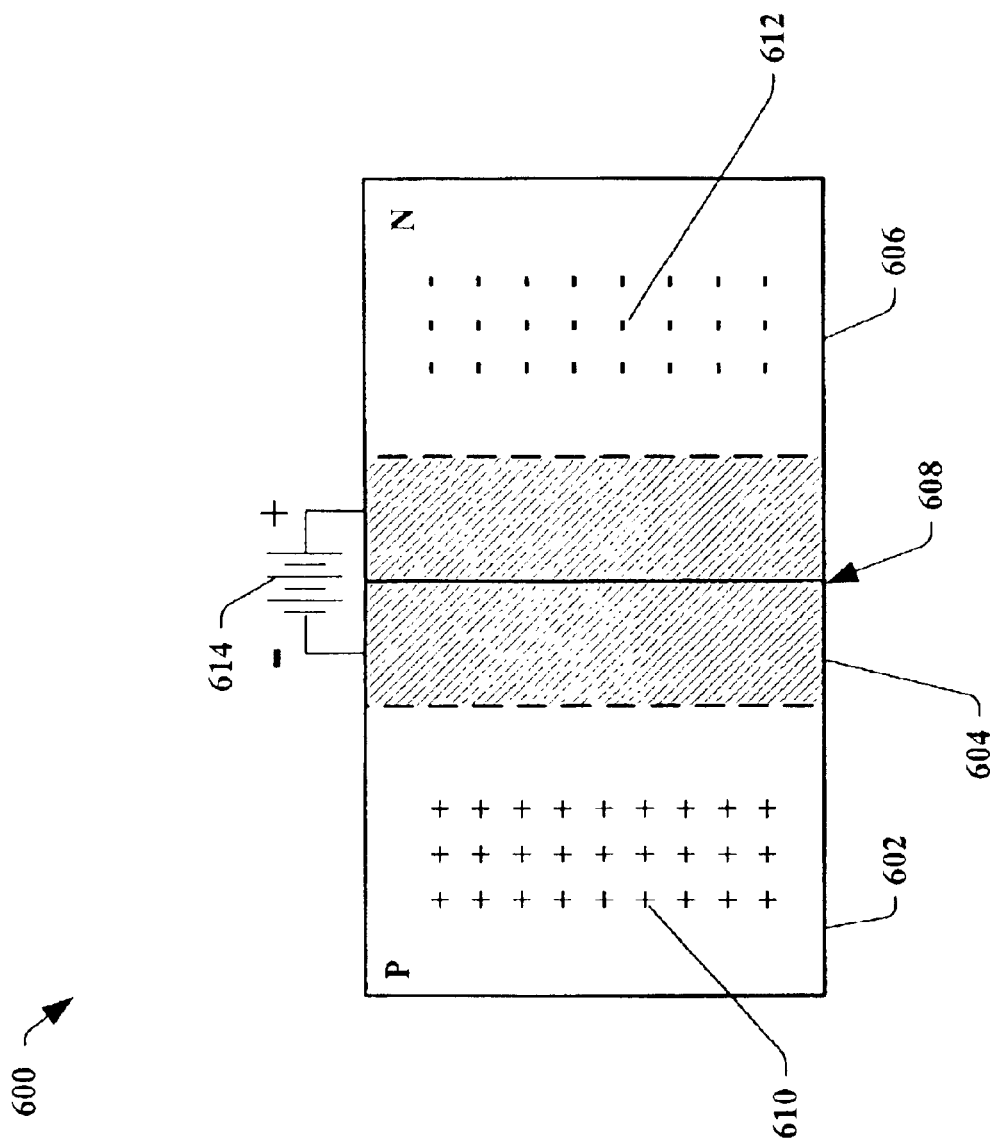
FIG. 6 is a diagram depicting diodic properties exhibited without an applied voltage bias in accordance with an aspect of the present invention.

Turning to FIG. 6, a diagram depicting diodic properties exhibited without an applied voltage bias 600 in accordance with an aspect of the present invention is shown. A p-type material 602 and an n-type material 606 are joined to form a diodic junction 608. The p-type material 602 contains a majority of positive carriers 610, while the n-type material contains a majority of negative carriers 612. When the two materials are joined, the negative and positive carriers exchange holes and electrons in a diffusing process known as junction recombination. This recombination reduces the number of free electrons and holes in the junction region, creating a depletion region 604. On the p-side 602 of the junction 608 in the depletion region 604, a layer of negatively charged ions exists. The n-side 606 of the depletion region 604 contains a layer of positively charged ions. This produces an electrostatic field 614 across the depletion region 604. The diffusion of electrons and holes continues until equilibrium is reached, dictated by the amount of energy required to overcome the electrostatic field 614. For carriers to move across the junction 608 beyond equilibrium, they must have enough potential to overcome the barrier presented by the electrostatic field 614.

Figure 7:
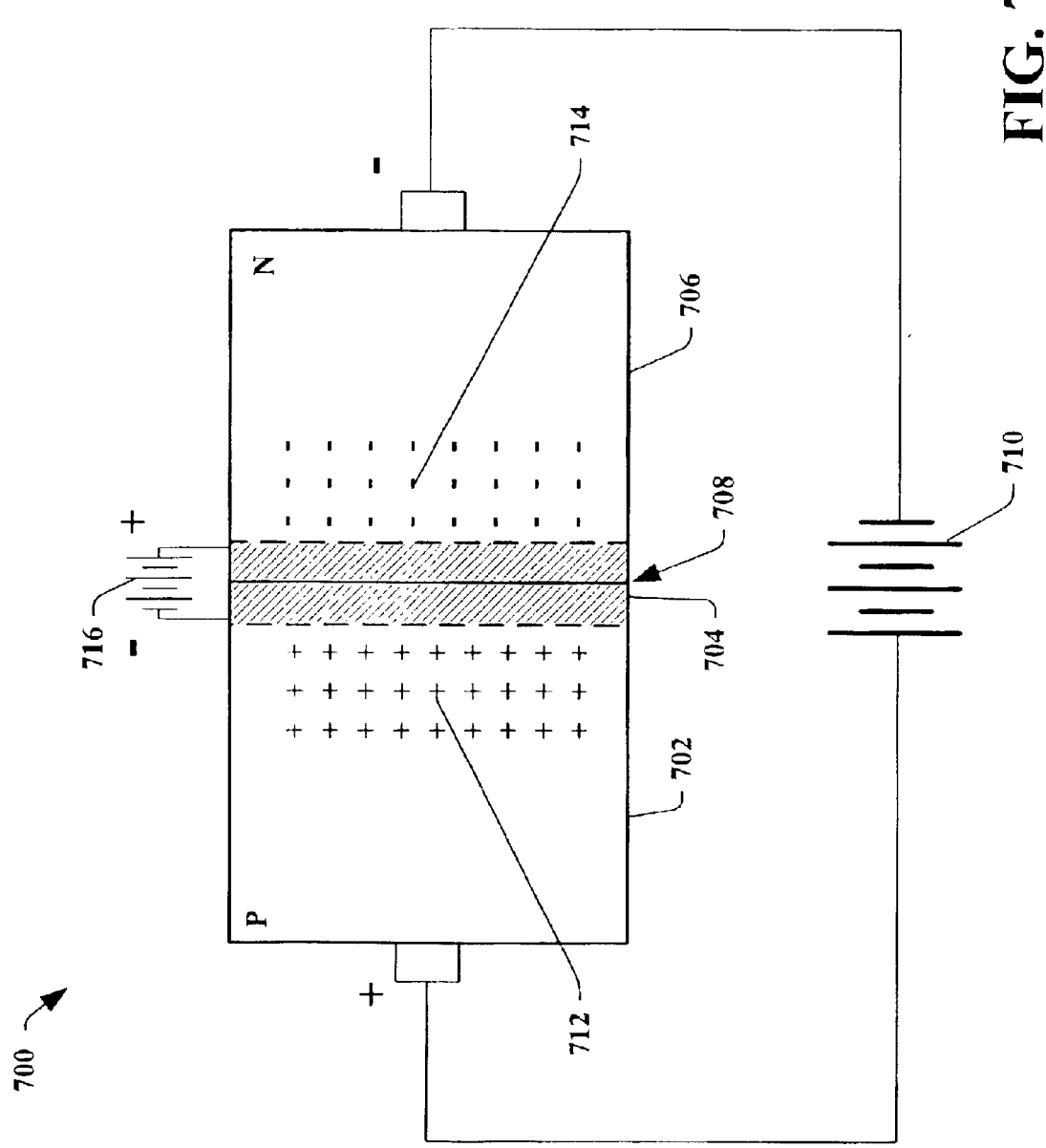
FIG. 7 is a diagram depicting diodic properties exhibited with an applied forward voltage bias in accordance with an aspect of the present invention.

FIG. 7 depicts a diagram of diodic properties exhibited with an applied forward voltage bias 700 in accordance with an aspect of the present invention. To forward bias a diodic junction 708, an external voltage 710 is applied with a polarity that opposes an electrostatic field 716 in a depletion region 704. This causes the depletion region 704 to be reduced, allowing the diodic junction 708 to present minimal resistance to the flow of current. Applying the external voltage 710 in this polarity forces positive carriers 712 in a p-type material 702 to be repelled by the positive potential of the external voltage 710 connected to the p-type material 702. Some of the repelled carriers combine with negative ions in a depletion region 704. Similarly, the negative potential of the external voltage 710 connected to an n-type material 706 drives negative carriers 714 towards the diodic junction 708. Some of these carriers combine with positive ions in the depletion region 704. This aids in reducing the width of the depletion region 704, reducing an electrostatic field 716 generated in the depletion region 704.

Current flow in a forward biased p-n junction is by the majority carriers 712, 714. Increasing the external voltage 710 also increases the number of majority carriers 712, 714 arriving at the diodic junction 708, elevating the current flow. Eventually, the external voltage 710 can be increased to a point where the diodic junction 708 offers very little resistance to current flow and the flow may cause heat damage to the device.

Figure 8:
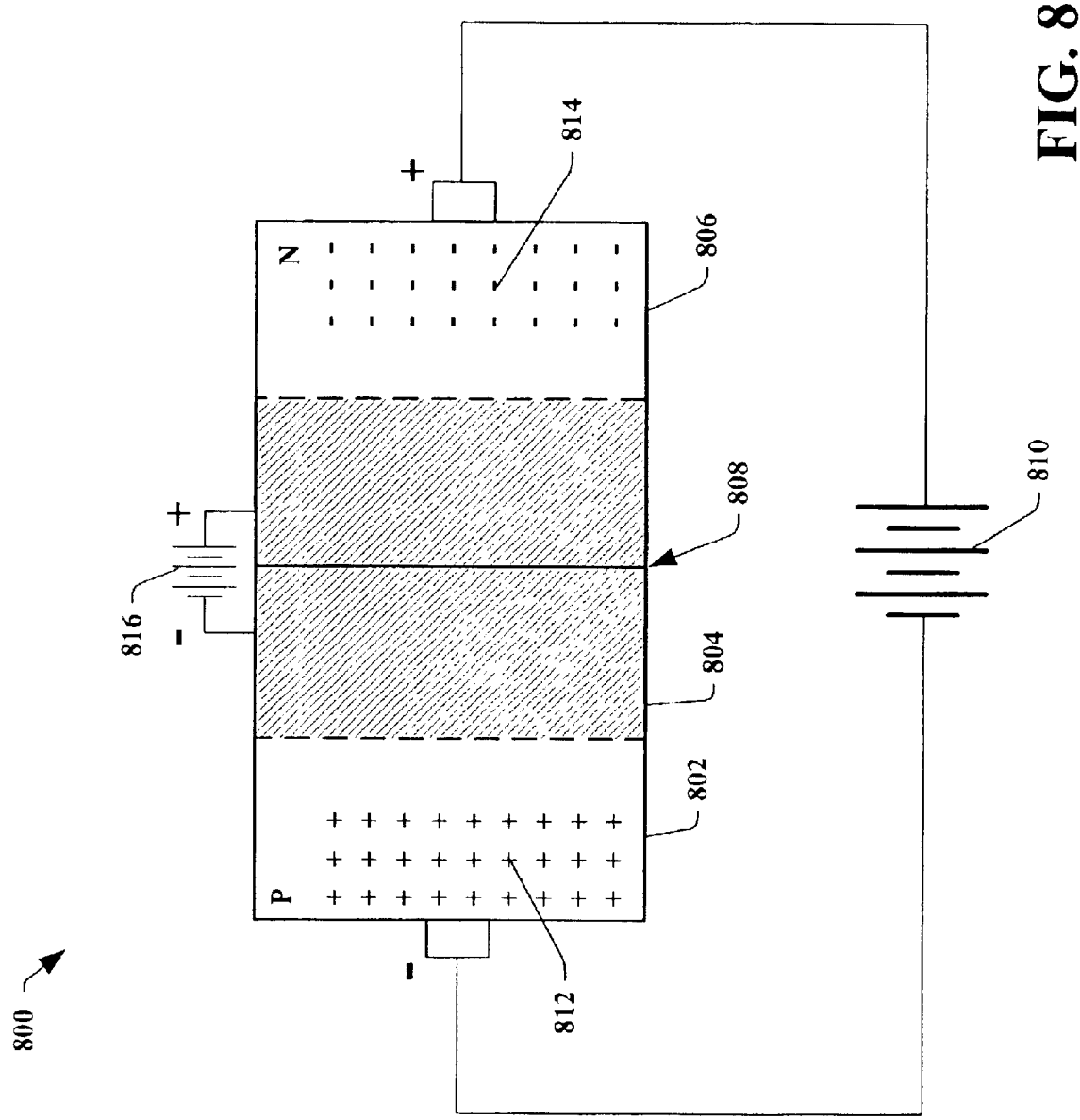
FIG. 8 is a diagram depicting diodic properties exhibited with an applied reverse voltage bias in accordance with an aspect of the present invention.

In reference to FIG. 8, a diagram depicting diodic properties exhibited with an applied reverse voltage bias 800 in accordance with an aspect of the present invention is shown. To reverse bias a diodic junction 808, an external voltage 810 is applied with a polarity that enhances an electrostatic field 816 generated by a depletion region 804. This causes the depletion region 804 to enlarge, allowing the diodic junction 808 to present maximum resistance to the flow of current. Applying the external voltage 810 in this polarity allows positive carriers 812 in a p-type material 802 to be attracted by the negative potential of the external voltage 810 connected to the p-type material 802. Similarly, the positive potential of the external voltage 810 connected to an n-type type material 806 attracts negative carriers 814 away from the diodic junction 808. This aids in enlarging the width of the depletion region 804, increasing the electrostatic field 816. More negative ions are now on the p-side 802 and more positive ions are now on the n-side 806. This increased number of ions prohibits current flow across the diodic junction 808 by the majority carriers 812, 814. However, current flow is not absolutely zero due to current flow by minority carriers which still cross the diodic junction 808. Generally, this current is considered negligible compared to the current flow of majority carriers.

Current flow in a reverse biased p-n junction is by minority carriers. In some types of diodes, namely zener-type diodes, the reverse bias voltage 810 can be raised to a predetermined level which produces a breakdown of the diodic junction 808. At this voltage level, current will flow through the device. Once the voltage level is reduced less than the breakdown voltage level, the diodic junction 808 will once again prohibit current flow.

The basics discussed supra cover most types of common diodes. However, there are specialized diodes that operate with slight variations. These variations are usually achieved through differing the amount of dopant impurities in a material utilized in the diode. It can be appreciated that any of these types of diodes can be used in the present invention also.

Figure 9:
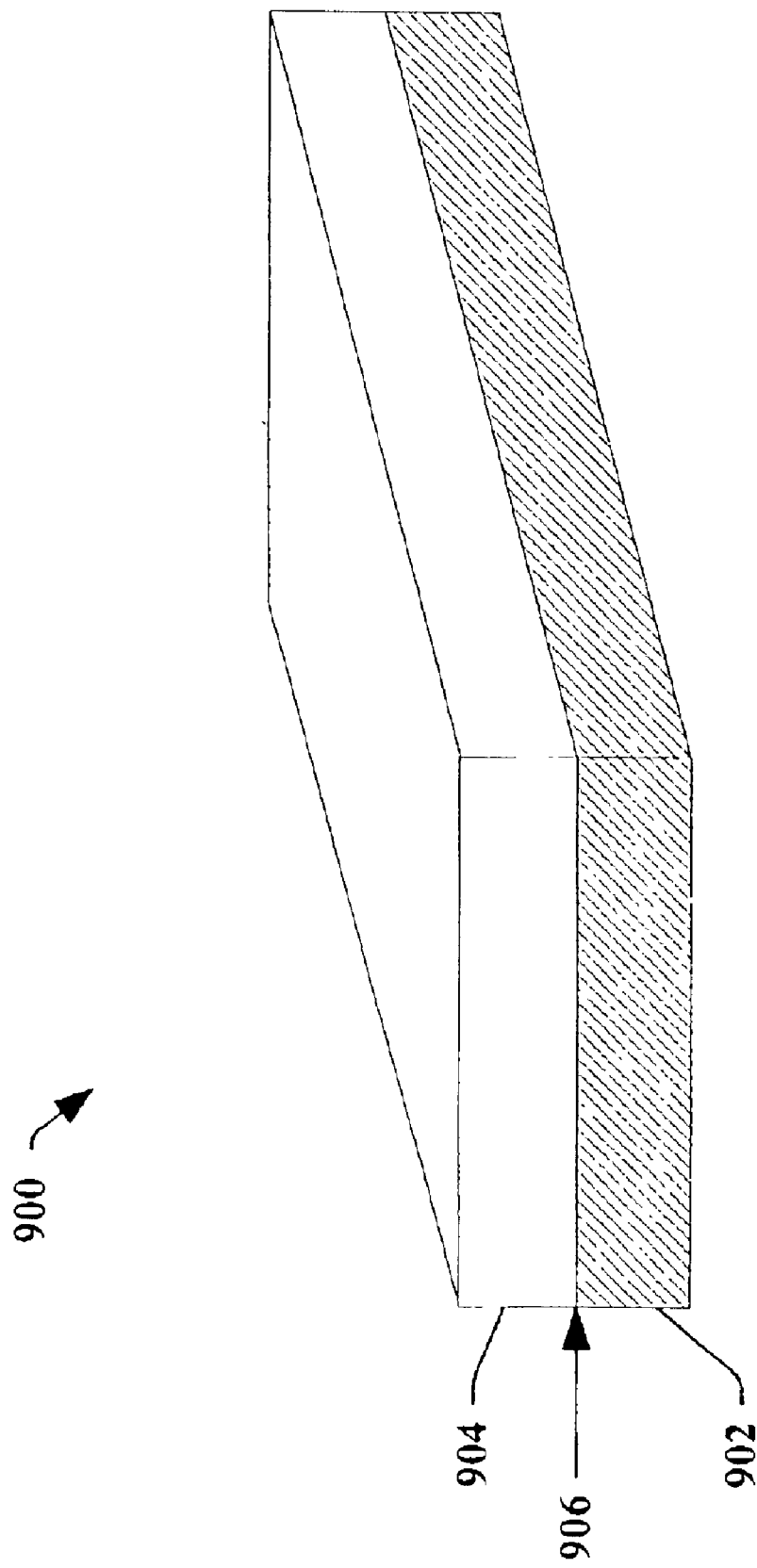
FIG. 9 is a three dimensional view of a diodic layer in accordance with an aspect of the present invention.

Turning to FIG. 9, a three dimensional view of a diodic layer 900 in accordance with an aspect of the present invention is illustrated. The diodic layer 900 comprises a first layer 902 and a second layer 904. The first layer 902 is coupled to a semiconductor cell (not shown, ref. FIG. 5). The second layer 904 is coupled to the first layer 902. The layers 902, 904 can be composed of any materials that create a diodic junction 906 between the two layers 902, 904. This effect can be due to the difference in work functions between the two layers 902, 904 and/or due to charge exchanges between the two layers 902, 904. The first layer 902 can be a thin film layer or a multi-film layer. It can be comprised of materials such as polysilicon, organic/inorganic conductors, semiconductors in crystal states, and semiconductors in amorphous states.

Selection of the material for the first and second layers 902, 904 is dependent upon the desired result required of the semiconductor device. The diodic layer 900 controls the amount of current that passes through the semiconductor device when an external voltage is applied. Thus, it is pertinent that the materials of the first and second layers 902, 904 contain the appropriate diodic properties to provide the capability to control the current of the semiconductor device as needed. Charge concentration in each of the materials along with the level of the bias voltage can alter the current flow through the semiconductor cell. To one skilled in the art, it can be appreciated that the diodic junction is not required to be solely a p-n type junction. As long as the desired characteristics of controlling the current are produced, the materials selected for the first and second layers 902, 904 can be utilized in the diodic layer 900.

Figure 10:
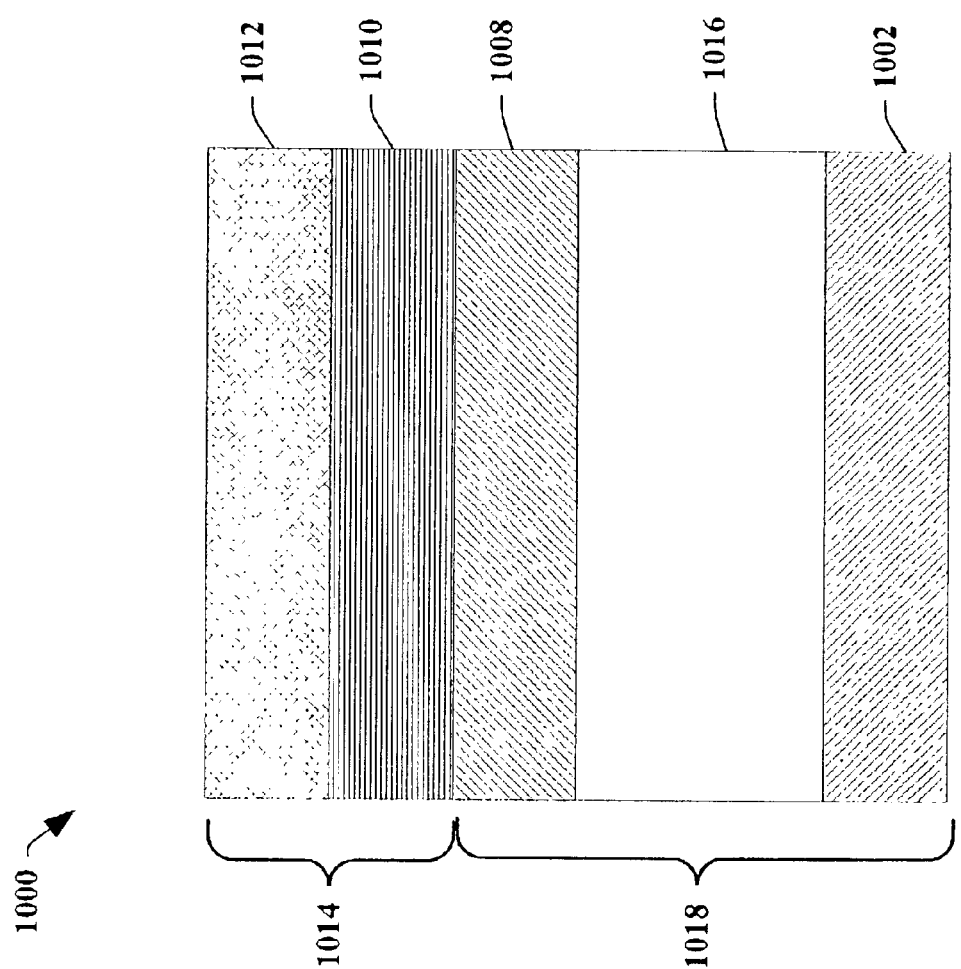
FIG. 10 is a diagram of a diodic OSM device in accordance with an aspect of the present invention.

Continuing on with FIG. 10, a diagram of a diodic OSM device 1000 in accordance with an aspect of the present invention is shown. This diodic OSM device 1000 is comprised of an organic semiconductor cell 1018 and a diodic layer 1014. The organic semiconductor cell 1018 is comprised of a first electrode 1002, an organic semiconductor layer 1016, and a second electrode 1008. The diodic layer 1014 comprises a thin film layer 1010 and a third electrode 1012.

The first, second and third electrodes 1002, 1008, 1012 are comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys. The thicknesses of the first, second and third electrodes 1002, 1008, 1012 can vary depending on the implementation and the semiconductor device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less. The conductive material utilized for each of the electrodes 1002, 1008, 1012 can be different.

The organic semiconductor layer 1016 can be a composition of materials required to fabricate a number of differing organic semiconductor devices. These include organic memory devices (discussed infra) and organic LED devices and the like. The present invention can be further utilized in other organic devices and in future devices not yet developed.

The diodic layer 1014 provides current regulation for the organic semiconductor layer 1016 when an external voltage is applied across the OSM device 1000 (allowing the OSM device to be self-regulating). In this respect, the materials chosen for the thin film layer 1010 and third electrode 1012 must be selected to facilitate the desired functionality of the semiconductor cell 1018, whether this be to store information in a memory cell or emit light in an LED and the like.

Figure 11:
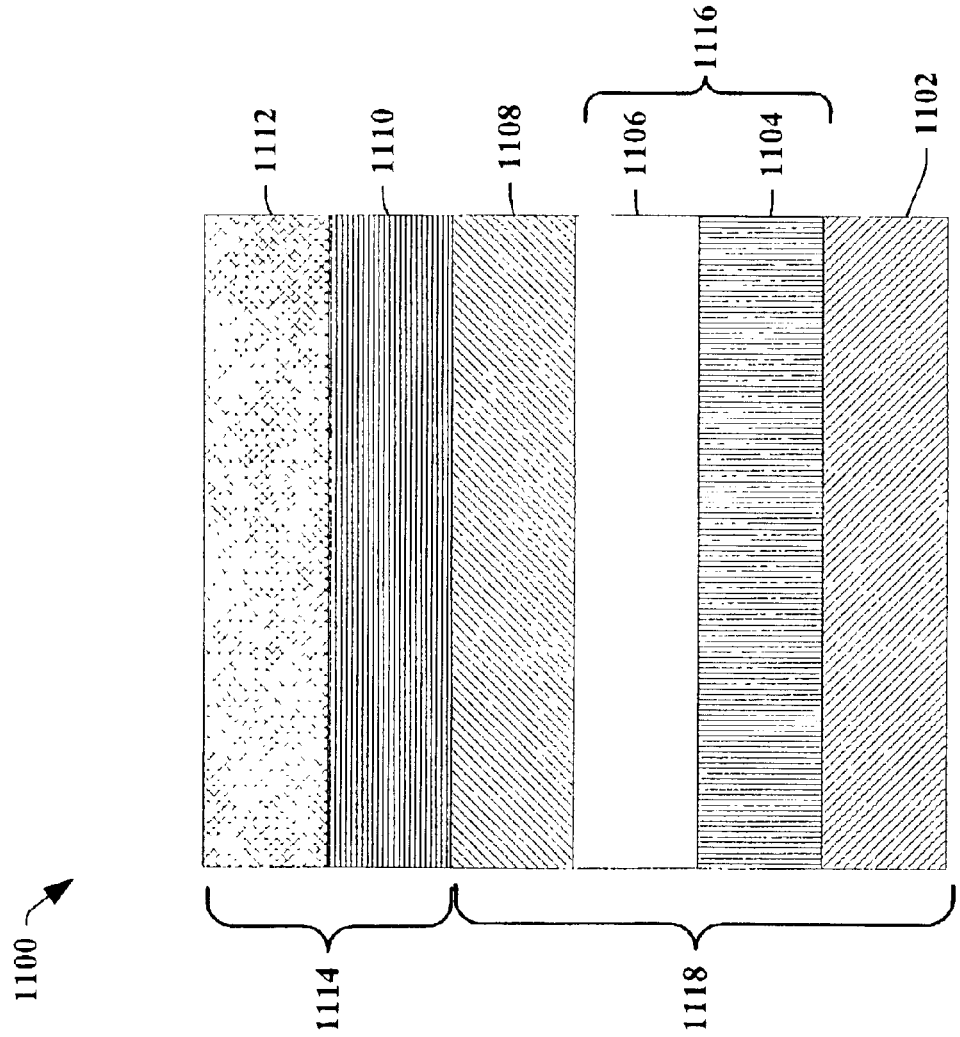
FIG. 11 is a diagram of another diodic OSM device in accordance with an aspect of the present invention.

Moving on to FIG. 11, a diagram of another diodic OSM device 1100 in accordance with an aspect of the present invention is illustrated. The OSM device 1100 comprises a diodic layer 1114 coupled to an organic memory cell 1118. The organic memory cell 1118 comprises a first electrode 1102, a selectively conductive organic layer 1116, and a second electrode 1108. The selectively conductive organic layer 1116 comprises a passive layer 1104 and an organic conductor layer 1106. The diodic layer 1114 comprises a thin film layer 1110 coupled to the second electrode 1108 and a third electrode 1112 coupled to the thin film layer 1110.

The first electrode 1102 is comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys. The thickness of the first electrode 1102 can vary depending on the implementation and the memory device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The passive layer 1104 contains at least one charge carrier assisting material that contributes to the controllable conductive properties of the selectively conductive organic layer 1116. The charge carrier assisting material has the ability to donate and accept charges (holes and/or electrons). Generally, the charge carrier assisting material has at least two relatively stable oxidation-reduction states. The two relatively stable states permit the charge carrier assisting material to donate and accept charges and electrically interact with the organic conductor layer 1106. The particular charge carrier assisting material employed is selected so that the two relatively stable states match with the two relatively stable states of the conjugated organic molecules of the organic conductor layer 1106.

The passive layer 1104 can, in some instances, act as a catalyst when forming the organic conductor layer 1106. In this configuration, the backbone of the conjugated organic molecule may initially form adjacent the passive layer 1104, and grow or assemble away and substantially perpendicular to the passive layer surface. As a result, the backbones of the conjugated organic molecules are self-aligned in a direction that traverses the two electrodes 1102, 1108.

Examples of charge carrier assisting material that may make up the passive layer 1104 include one or more of the following: nickel arsenide (NiAs), cobalt arsenide ($CoAs_2$), copper sulfide ($Cu_2S$, CuS), copper oxide (CuO, $Cu_2O$), manganese oxide ($MnO_2$), titanium dioxide ($TiO_2$), indium oxide ($I_3O_4$), silver sulfide ($Ag_2S$, AgS), iron oxide ($Fe_3O_4$), and the like. The passive layer 1104 is typically grown using oxidation techniques, formed by gas phase reactions, or deposited between the electrodes.

The passive layer 1104 has a suitable thickness that can vary according to the implementation and/or memory device being fabricated. Some examples of suitable thicknesses for the passive layer 1104 are as follows: a thickness of about 2 Å or more and about 0.1 $\mu$m or less, a thickness of about 10 Å or more and about 0.01 $\mu$m or less, and a thickness of about 50 Å or more and about 0.005 $\mu$m or less.

The organic conductor layer 1106 comprises a conjugated molecule(s). Such conjugated molecules are characterized in that they have overlapping $\pi$ orbitals and that they can assume two or more resonant structures. The organic molecules may be cyclic or acyclic. During formation or deposition, the organic molecule self assembles between the electrodes. Examples of conjugated organic materials include one or more of polyacetylene (cis or trans); polyphenylacetylene (cis or trans); polydiphenylaectylene; polyaniline; poly (p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the polymer can be modified by doping with a suitable dopant (e.g., salt).

The organic conductor layer 1106 is formed with a suitable thickness that depends upon the chosen implementations and/or the memory device being fabricated. Some suitable exemplary ranges of thickness for the organic conductor layer 1106 are about 0.001 $\mu$m or more and about 5 $\mu$m or less, about 0.01 $\mu$m or more and about 2.5 $\mu$m or less, and about a thickness of about 0.05 $\mu$m or more and about 1 $\mu$m or less.

The organic conductor layer 1106 can be formed by a number of suitable techniques, some of which are described above. One suitable technique that can be utilized is a spin-on technique that involves depositing a mixture of the polymer/polymer precursor and a solvent, and then removing the solvent from the substrate/electrode. Another technique is chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer.

In order to facilitate operation of the organic memory device 1100, the organic conductor layer 1106 is generally substantially thicker than the passive layer. As one example, the thickness of the organic conductor layer 1106 is from about 10 to about 500 times greater than the thickness of the passive layer 1104. It is appreciated that other suitable ratios can be employed in accordance with the present invention.

The organic conductor layer 1106 and the passive layer 1104 are collectively referred to as a selectively conductive organic layer 1116. The conductive properties of this layer (e.g., conductive, non-conductive, semi-conductive) are modified, in a controlled manner, by applying various voltages (e.g., bias voltages) across the layer.

The second electrode 1108 is formed of a conductive material in a manner similar to that of the first electrode 1102. The second electrode 1108 can, but is not required to, be formed of the same conductive material as the first electrode 1102.

The thin film layer 1110 is any material possessing the necessary characteristics to form the desired diodic behavior. The thin film layer 1110 can be deposited on the second electrode 1108 in any manner suitable for the type of fabrication being used. This can include chemical vapor deposition (CVD) processes such as atmospheric pressure CVD (APCVD), low pressure CVD (LPCVD), plasma-enhanced CVD (PECVD), photochemical (ultraviolet) (LPCVD), vapor phase epitaxy (VPE), and metalorganic CVD (MOCVD). Additional non-CVD methods such as molecular beam epitaxy (MBE) are also acceptable.

The third electrode 1112 can be deposited on the thin film layer in any manner that maintains the diodic junction characteristics desired for a particular organic memory cell. This can include chemical vapor deposition (CVD) processes such as atmospheric pressure CVD (APCVD), low pressure CVD (LPCVD), plasma-enhanced CVD (PECVD), photochemical (ultraviolet) (LPCVD), vapor phase epitaxy (VPE), and metalorganic CVD (MOCVD). Additional non-CVD methods such as molecular beam epitaxy (MBE) are also acceptable.

The third electrode 1112 is comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal suicides, and the like. Exemplary alloys that can be utilized for the conductive material include Hastelloy®, Kovar®, Invar, Monel®, Inconel®, brass, stainless steel, magnesium-silver alloy, and various other alloys. The thickness of the third electrode 1112 can vary depending on the implementation and the OSM device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The diodic layer 1114 is used to control or program the organic memory cell 1118. The organic memory cell 1118 has the capability of storing multiple states of information based upon its resistance to the flow of current. Thus, when voltages are applied across the organic memory cell 1118, the resulting current can be measured to determine the state of the memory cell 1118. This process allows the data in the cell 1118 to be "read". The memory cell can also be programmed to various states by applying larger values of voltage across the cell 1118. The cell 1118 can also be erased in a likewise manner utilizing the applied voltage. The diodic layer 1114 facilitates this process by regulating the amount of current going through the memory cell 1118 when a voltage is applied across the OSM device 1100. In one aspect of the present invention, the diodic layer can have zener-type characteristics (discussed infra). Reversing the bias voltage across the OSM device 1100 at a level higher than the breakdown voltage can be used to erase the memory cell 1118.

Figure 12:
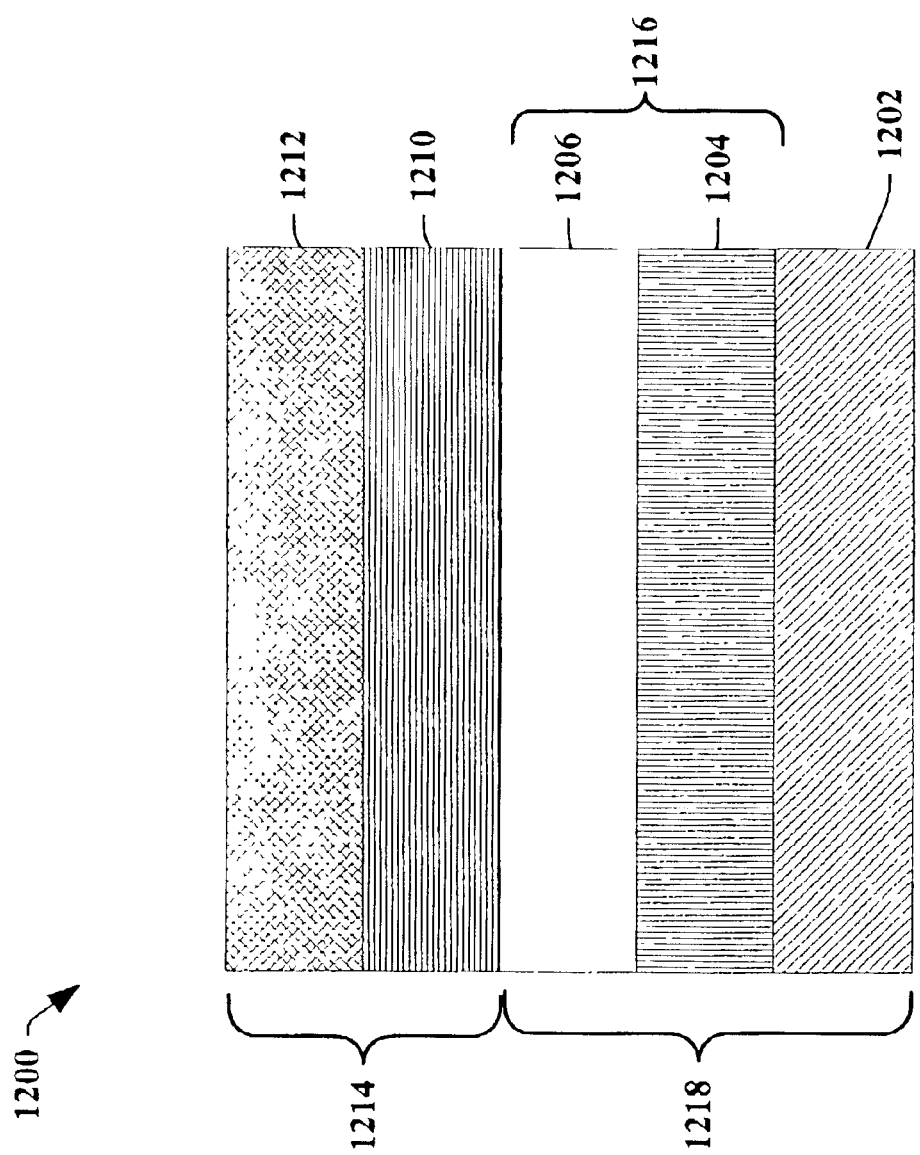
FIG. 12 is a diagram of yet another diodic OSM device in accordance with an aspect of the present invention.

Referring to FIG. 12, a diagram of yet another diodic OSM device 1200 in accordance with an aspect of the present invention is shown. The OSM device 1200 comprises a diodic layer 1214 coupled to an organic memory cell 1218. The organic memory cell 1218 comprises a first electrode 1202 and a selectively conductive organic layer 1216. The selectively conductive organic layer 1216 comprises a passive layer 1204 and an organic conductor layer 1206. The diodic layer 1214 comprises a thin film layer 1210 coupled to the organic conductor layer 1206 and a second electrode 1212 coupled to the thin film layer 1210.

The first electrode 1202 is comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys. The thickness of the first electrode 1202 can vary depending on the implementation and the memory device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The passive layer 1204 contains at least one charge carrier assisting material that contributes to the controllable conductive properties of the selectively conductive organic layer 1216. The charge carrier assisting material has the ability to donate and accept charges (holes and/or electrons). Generally, the charge carrier assisting material has at least two relatively stable oxidation-reduction states. The two relatively stable states permit the charge carrier assisting material to donate and accept charges and electrically interact with the organic conductor layer 1206. The particular charge carrier assisting material employed is selected so that the two relatively stable states match with the two relatively stable states of the conjugated organic molecules of the organic conductor layer 1206.

The passive layer 1204 can, in some instances, act as a catalyst when forming the organic conductor layer 1206. In this configuration, the backbone of the conjugated organic molecule may initially form adjacent the passive layer 1204, and grow or assemble away and substantially perpendicular to the passive layer surface. As a result, the backbones of the conjugated organic molecules are self-aligned in a direction perpendicular to the first electrode 1202.

Examples of charge carrier assisting material that may make up the passive layer 1204 include one or more of the following: nickel arsenide (NiAs), cobalt arsenide ($CoAs_2$), copper sulfide ($Cu_2S$, CuS), copper oxide (CuO, $Cu_2O$), manganese oxide ($MnO_2$), titanium dioxide ($TiO_2$), indium oxide ($I_3O_4$), silver sulfide ($Ag_2S$, AgS), iron oxide ($Fe_3O_4$), and the like. The passive layer 1204 is typically grown using oxidation techniques, formed by gas phase reactions, or deposited on the first electrode 1202.

The passive layer 1204 has a suitable thickness that can vary according to the implementation and/or memory device being fabricated. Some examples of suitable thicknesses for the passive layer 1204 are as follows: a thickness of about 2 Å or more and about 0.1 $\mu$m or less, a thickness of about 10 Å or more and about 0.01 $\mu$m or less, and a thickness of about 50 Å or more and about 0.005 $\mu$m or less.

The organic conductor layer 1206 comprises a conjugated molecule(s). Such conjugated molecules are characterized in that they have overlapping $\pi$ orbitals and that they can assume two or more resonant structures. The organic molecules may be cyclic or acyclic. During formation or deposition, the organic molecule self assembles. Examples of conjugated organic materials include one or more of polyacetylene (cis or trans); polyphenylacetylene (cis or trans); polydiphenylacetylene; polyaniline; poly (p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the polymer can be modified by doping with a suitable dopant (e.g., salt).

The organic conductor layer 1206 is formed with a suitable thickness that depends upon the chosen implementations and/or the memory device being fabricated. Some suitable exemplary ranges of thickness for the organic conductor layer 1206 are about 0.001 $\mu$m or more and about 5 $\mu$m or less, about 0.01 $\mu$m or more and about 2.5 $\mu$m or less, and about a thickness of about 0.05 $\mu$m or more and about 1 $\mu$m or less.

The organic conductor layer 1206 can be formed by a number of suitable techniques, some of which are described above. One suitable technique that can be utilized is a spin-on technique that involves depositing a mixture of the polymer/polymer precursor and a solvent, and then removing the solvent from the substrate/electrode. Another technique is chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer.

In order to facilitate operation of the organic memory device 1200, the organic conductor layer 1206 is generally substantially thicker than the passive layer. As one example, the thickness of the organic conductor layer 1206 is from about 10 to about 500 times greater than the thickness of the passive layer 1204. It is appreciated that other suitable ratios can be employed in accordance with the present invention.

The organic conductor layer 1206 and the passive layer 1204 are collectively referred to as a selectively conductive organic layer 1216. The conductive properties of this layer (e.g., conductive, non-conductive, semi-conductive) are modified, in a controlled manner, by applying various voltages (e.g., bias voltages) across the layer.

The thin film layer 1210 is any material possessing the necessary characteristics to form the desired diodic behavior. The thin film layer 1210 can be deposited on the conductive organic layer 1206 in any manner suitable for the type of fabrication being used. This can include chemical vapor deposition (CVD) processes such as atmospheric pressure CVD (APCVD), low pressure CVD (LPCVD), plasma-enhanced CVD (PECVD), photochemical (ultraviolet) (LPCVD), vapor phase epitaxy (VPE), and metalorganic CVD (MOCVD). Additional non-CVD methods such as molecular beam epitaxy (MBE) are also acceptable.

The second electrode 1212 can be deposited on the thin film layer in any manner that maintains the diodic junction characteristics desired for a particular organic memory cell. This can include chemical vapor deposition (CVD) processes such as atmospheric pressure CVD (APCVD), low pressure CVD (LPCVD), plasma-enhanced CVD (PECVD), photochemical (ultraviolet) (LPCVD), vapor phase epitaxy (VPE), and metalorganic CVD (MOCVD). Additional non-CVD methods such as molecular beam epitaxy (MBE) are also acceptable.

The second electrode 1212 is comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys. The thickness of the second electrode 1212 can vary depending on the implementation and the OSM device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The diodic layer 1214 is used to control or program the organic memory cell 1218. The organic memory cell 1218 has the capability of storing multiple states of information based upon its resistance to the flow of current. Thus, when voltages are applied across the organic memory cell 1218, the resulting current can be measured to determine the state of the memory cell 1218. This process allows the data in the cell 1218 to be "read". The memory cell can also be programmed to various states by applying larger values of voltage across the cell 1218. The cell 1218 can also be erased in a likewise manner utilizing the applied voltage. The diodic layer 1214 facilitates this process by regulating the amount of current going through the memory cell 1218 when a voltage is applied across the OSM device 1200. In one aspect of the present invention, the diodic layer can have zener-type characteristics (discussed infra). Reversing the bias voltage across the OSM device 1200 at a level higher than the breakdown voltage can be used to erase the memory cell 1218.

Figure 13:
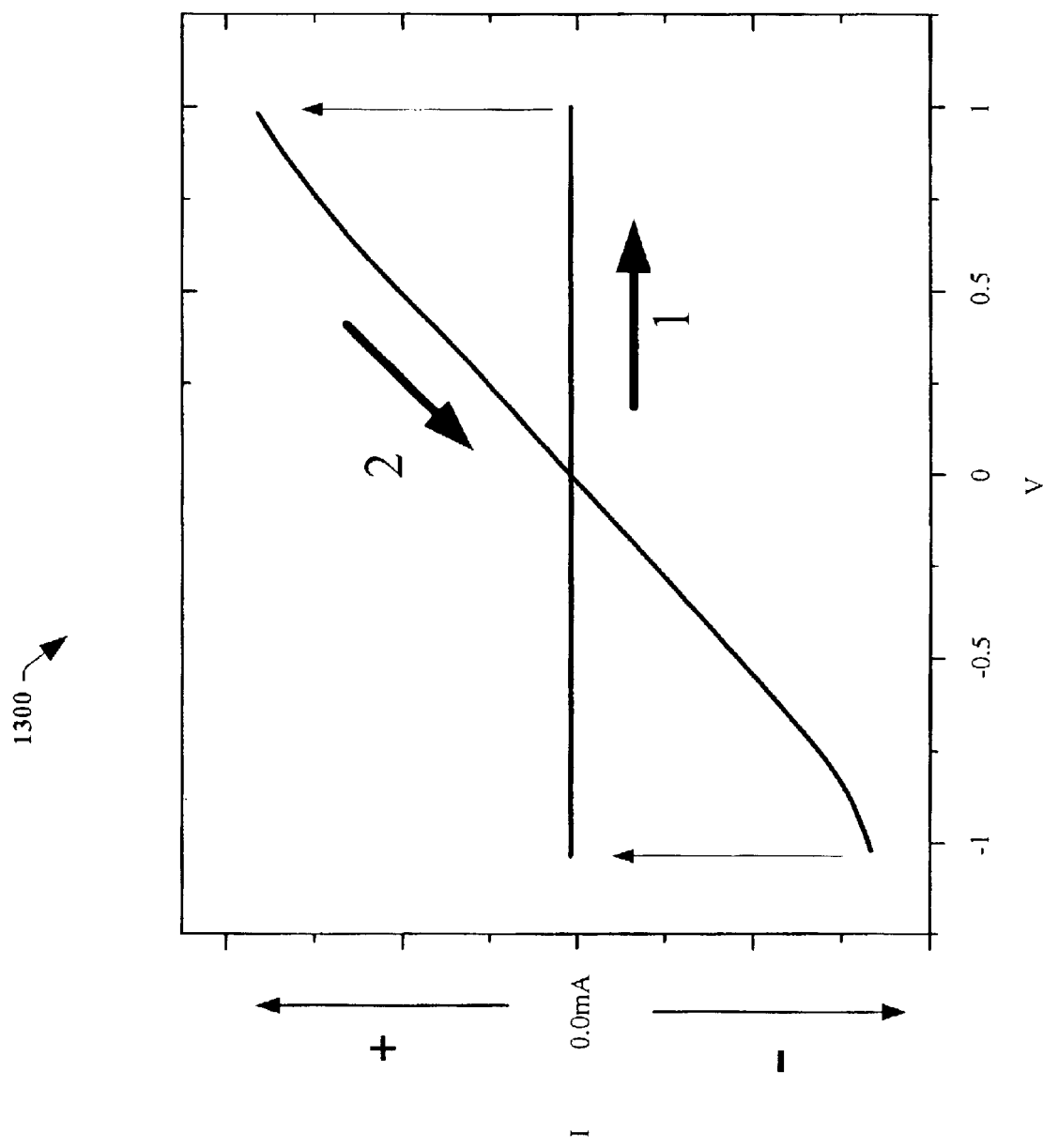
FIG. 13 is a graph illustrating I–V characteristics for an organic memory device in accordance with an aspect of the present invention.

Referring to FIG. 13, a graph illustrating I-V characteristics for an organic memory device 1300 in accordance with an aspect of the present invention. It can be seen that from state 1, which indicates "off", the device can be modified to be in state 2, which indicates "on", by applying a positive voltage of 1 V. Additionally, it can be seen that while in state 1, the organic memory device has a high impedance and low conductance. Subsequently, the device 1300 can be modified to change from state 2 to state 1 by application of a negative voltage, therein causing a reverse current until the state 1 is obtained.

Figure 14:
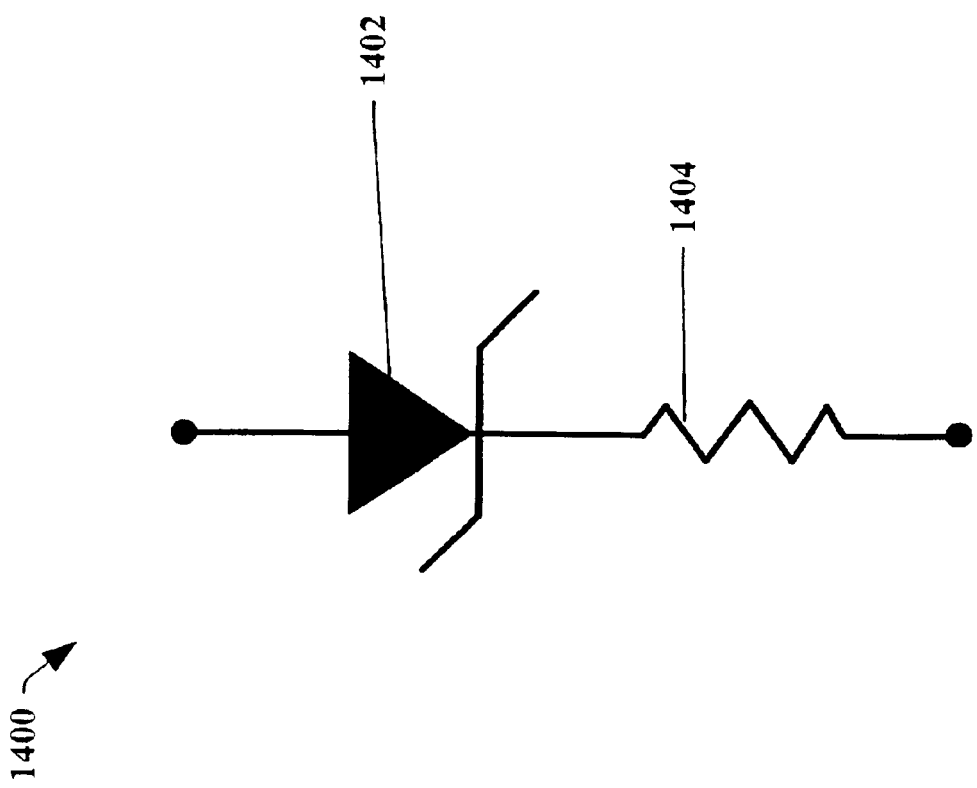
FIG. 14 is a diagram illustrating a zener-type diodic device in accordance with an aspect of the present invention.

Turning to FIG. 14, a diagram illustrating a zener-type diodic semiconductor device 1400 in accordance with an aspect of the present invention is shown. The semiconductor device 1400 is modeled as a zener diode 1402 and a resistor 1404. The zener diode 1402 is representative of the diodic layer of the present invention. The resistor 1404 is representative of a memory cell. The zener diode 1402 operates as a normal diode unless a specific predetermined reverse bias voltage is applied to cause a breakdown. Thus, during normal operation current will flow through the resistor (memory cell) 1404. This allows the application of various voltages to program and read various states of the memory cell 1404. For instance, erasure of the memory cell 1404 can be accomplished by utilizing the unique nature of a zener diode to breakdown when a predetermined reverse bias voltage is applied. This is discussed infra.

Figure 15:
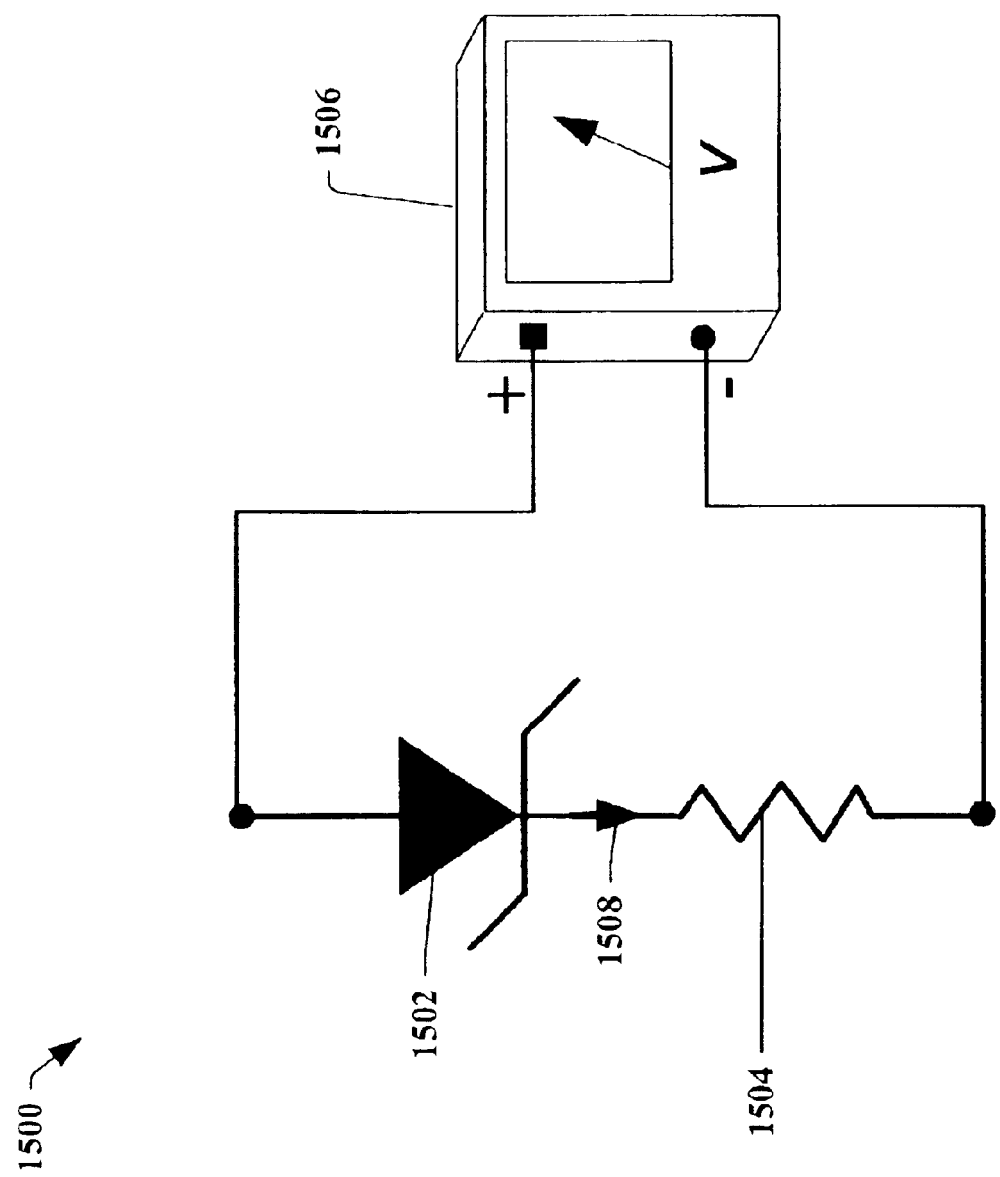
FIG. 15 is a diagram illustrating a zener-type diodic device with an applied forward bias voltage in accordance with an aspect of the present invention.

In FIG. 15, a diagram illustrating a zener-type diodic semiconductor device 1500 with an applied forward bias voltage in accordance with an aspect of the present invention is depicted. The semiconductor device 1500 has a forward voltage applied across the device 1500 by a voltage source 1506. The forward voltage is greater than the switch-on voltage level of a zener-type diodic layer 1502. Thus, current 1508 is allowed to flow through the memory cell 1504. The actual current value is dependent upon the value of the applied voltage from the voltage source 1506. In this manner, the memory cell 1504 can be programmed and/or read.

Figure 16:
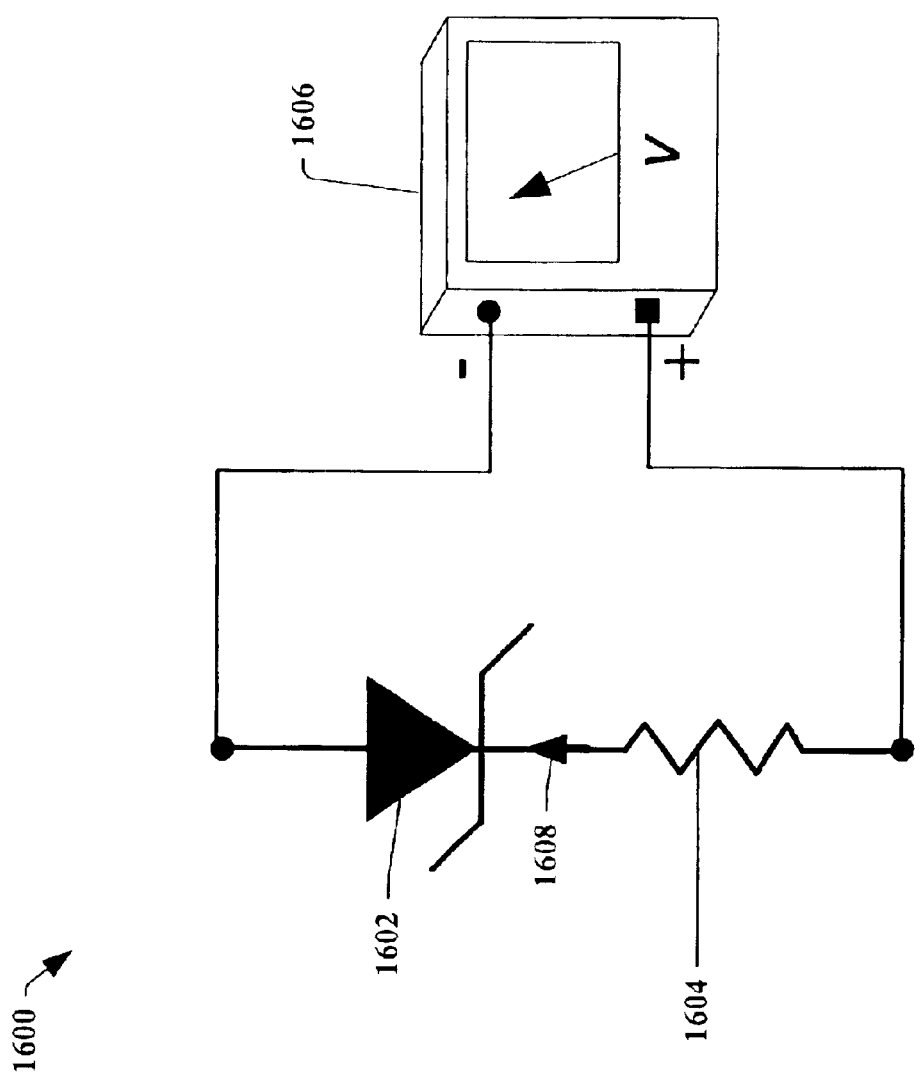
FIG. 16 is a diagram illustrating a zener-type diodic device with an applied reverse bias voltage in accordance with an aspect of the present invention.

Referring to FIG. 16, a diagram illustrating a zener-type diodic semiconductor device 1600 with an applied reverse bias voltage in accordance with an aspect of the present invention. The semiconductor device 1600 has a reverse bias voltage applied across it by a voltage source 1606. The voltage level is less than the breakdown, voltage level of the zener-type diodic layer represented as a zener diode 1602. The leakage current of the zener diode 1602 is very small and, thus, the current flow 1608 through the memory cell 1604 is also small. Because the zener diode cannot flow a significant amount of current until a certain reverse bias voltage threshold is reached (breakdown voltage), it prevents inadvertent low level reverse bias voltages from erasing the memory cell 1604. Thus, it is desirable to select diodic layer materials that possess low leakage current characteristics.

Figure 17:
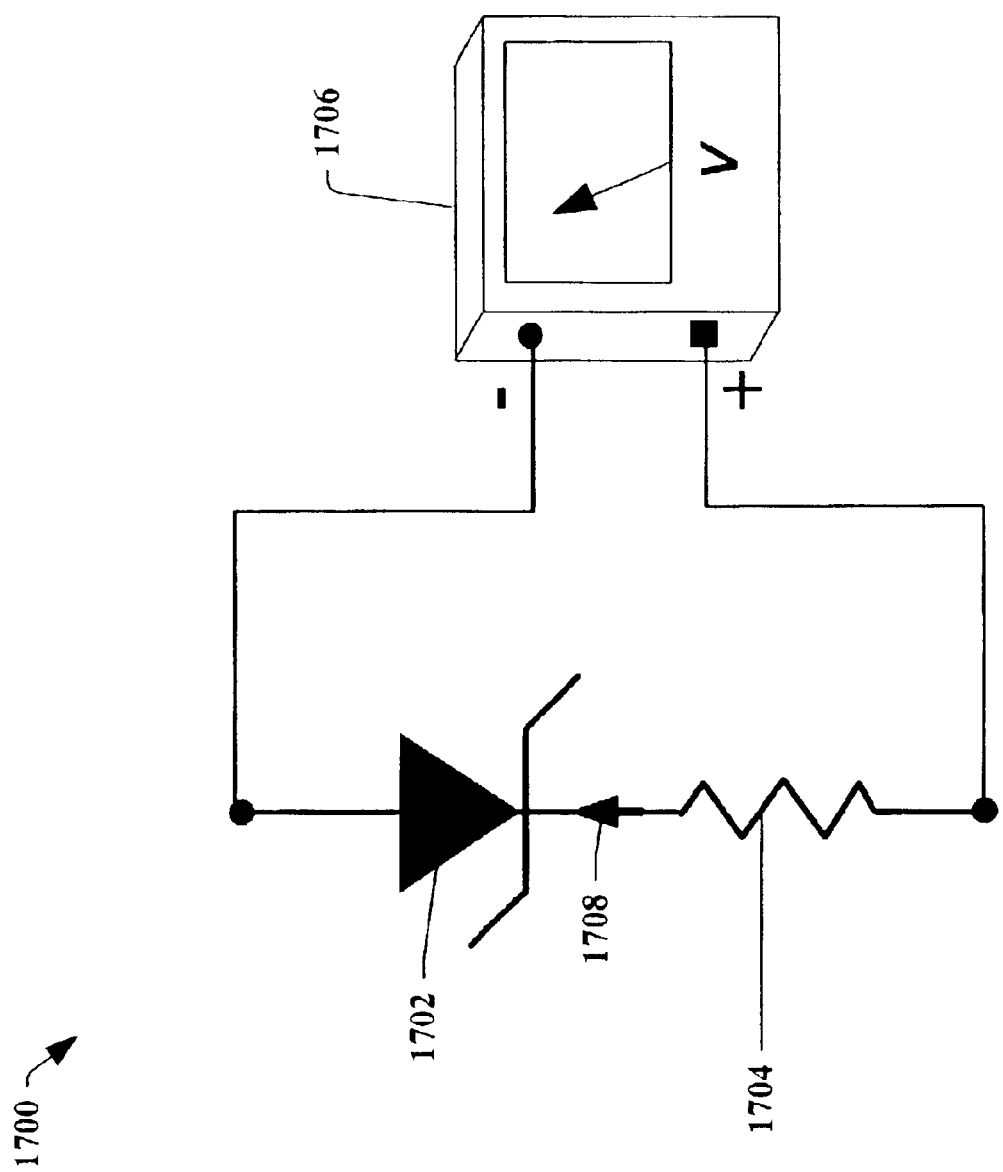
FIG. 17 is a diagram illustrating a zener-type diodic device with an applied reverse bias voltage greater than the zener breakdown voltage in accordance with an aspect of the present invention.

Continuing with FIG. 17, a diagram illustrating a zener-type diodic semiconductor device 1700 with an applied reverse bias voltage greater than the zener breakdown voltage in accordance with an aspect of the present invention is shown. The semiconductor device 1700 has a reverse bias voltage greater than the zener breakdown voltage applied across it by a voltage source 1706. The semiconductor cell 1704 working in conjunction with the diodic layer 1702 will have some potential drop across it. Thus, the voltage across the semiconductor device 1700 will generally need to be greater than the breakdown voltage associated with the diodic layer 1702 to account for the potential drop of the semiconductor cell 1704. Likewise, if the semiconductor cell 1704 requires a certain voltage level to perform its operation, the voltage drop across the zener diode must be taken into account also. When breakdown occurs, a current flow 1708 through the memory cell 1704 is maximized. This current flow 1708 is sufficient to provide an operational function, such as erasing and/or programming the memory cell 1704.

Figure 18:
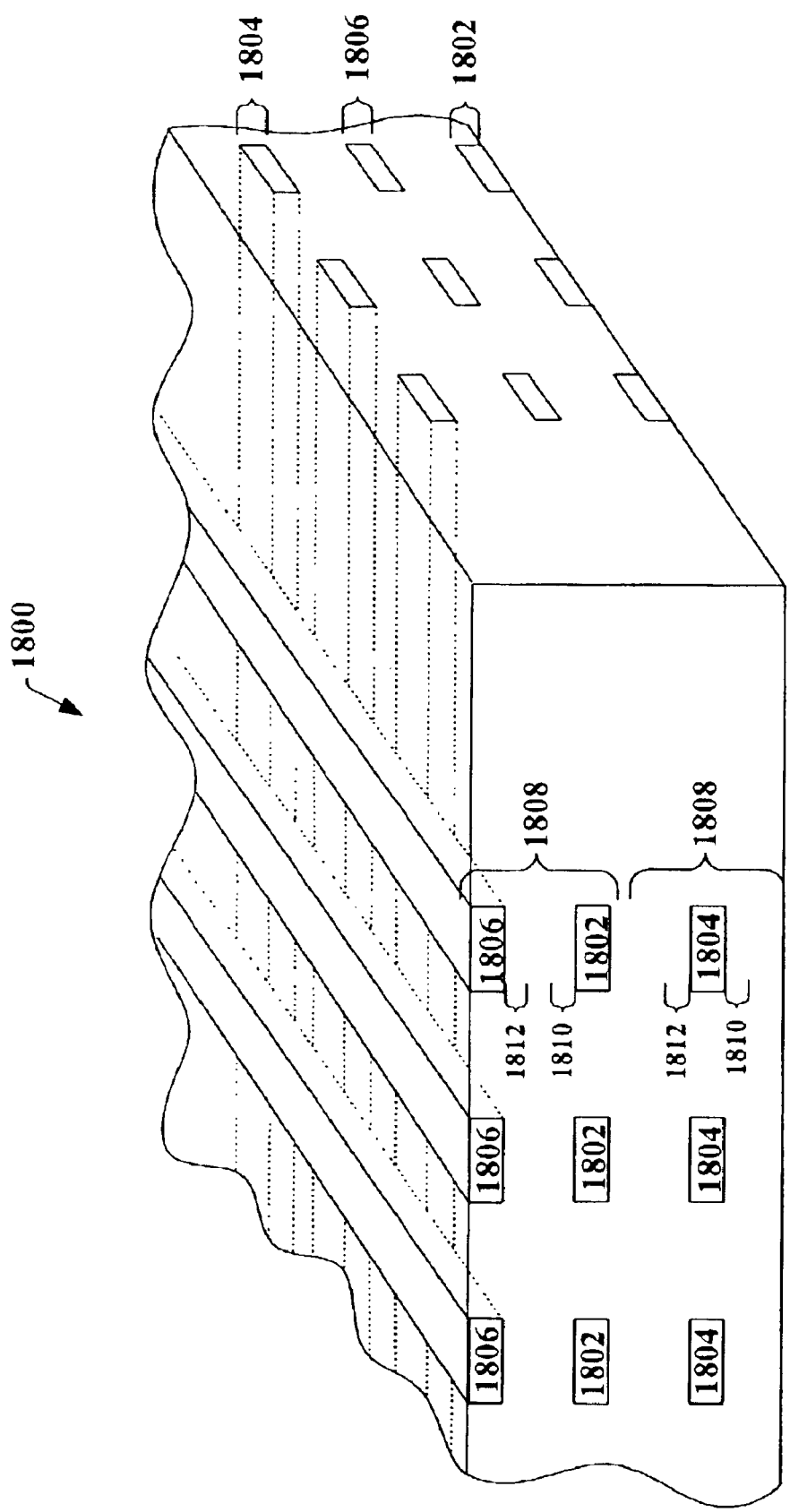
FIG. 18 is a three dimensional view of a diodic OSM device in accordance with an aspect of the present invention.

In FIG. 18, a three dimensional view of a diodic OSM device 1800 in accordance with an aspect of the present invention is illustrated. The organic memory device 1800 contains a plurality of first electrodes 1802, a plurality of second electrodes 1804, a plurality of third electrodes 1806, a plurality of selectively conductive organic layers 1810, and a plurality of diodic layers 1812. The selectively conductive organic layers are 1810 between the first and second electrodes 1802, 1804. The plurality of first electrodes 1802, the plurality of second electrodes 1804, and the plurality of third electrodes 1806 are shown in substantially perpendicular orientation, although other orientations are possible. The three dimensional microelectronic organic device is capable of containing an extremely high number of cells thereby improving device density. Peripheral circuitry and devices are not shown for brevity.

The present invention memory cells/devices are useful in any device requiring memory. For example, the memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, palm pilots, pagers, notebook computers, remote controls, recorders (video and audio), radios, small televisions and web viewers, cameras, and the like.

Figure 19:
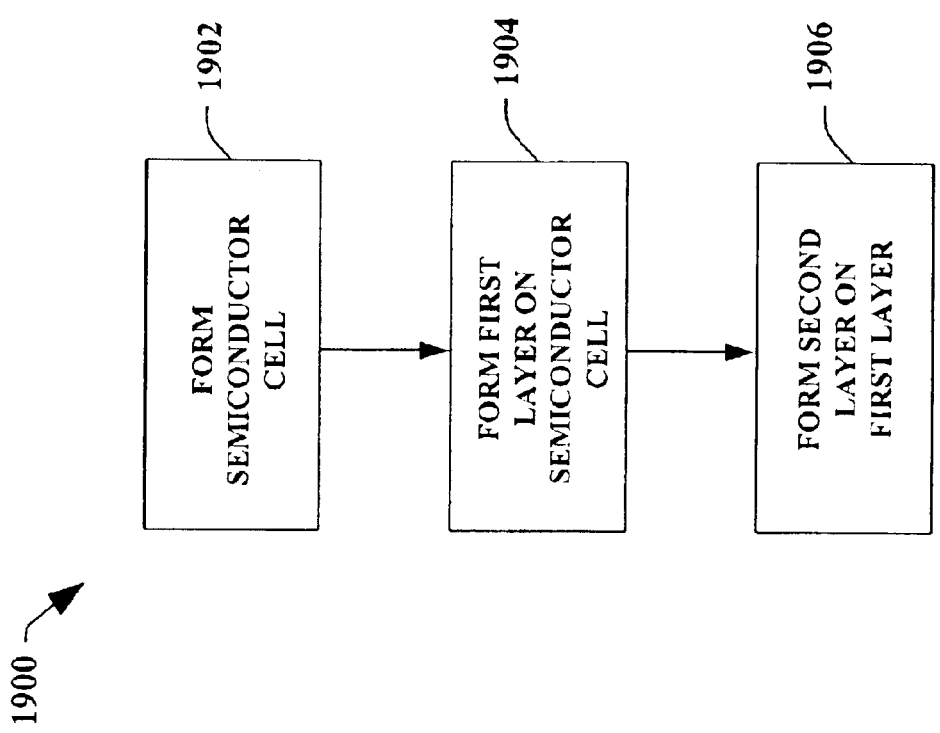
FIG. 19 is a flow diagram illustrating a method of fabricating a diodic device in accordance with an aspect of the present invention.

In view of the exemplary systems shown and described above, methodologies, which may be implemented in accordance with one or more aspects of the present invention, will be better appreciated with reference to the flow diagram of FIG. 19. While, for purposes of simplicity of explanation, the methodology is shown and described as a series of function blocks, it is to be understood and appreciated that the present invention is not limited by the order of the blocks, as some blocks may, in accordance with the present invention, occur in different orders and/or concurrently with other blocks from that shown and described herein.

Moreover, not all illustrated blocks may be required to implement a methodology in accordance with one or more aspects of the present invention. It is to be appreciated that the various blocks may be implemented via software, hardware a combination thereof or any other suitable means (e.g. device, system, process, component) for carrying out the functionality associated with the blocks. It is also to be appreciated that the blocks are merely to illustrate certain aspects of the present invention in a simplified form and that these aspects may be illustrated via a lesser and/or greater number of blocks.

Continuing with FIG. 19, a flow diagram illustrating a method 1900 of fabricating a diodic semiconductor device in accordance with an aspect of the present invention is shown. The method 1900 depicts one aspect of the present invention. A semiconductor cell is first formed 1902 in any manner suitable for the type of device being fabricated. A first layer is formed on the semiconductor cell 1904. Then a second layer is formed on the first layer 1906. The first layer can be deposited on the semiconductor cell in any manner suitable for the type of fabrication being used. This can include chemical vapor deposition (CVD) processes such as atmospheric pressure CVD (APCVD), low pressure CVD (LPCVD), plasma-enhanced CVD (PECVD), photochemical (ultraviolet) (LPCVD), vapor phase epitaxy (VPE), and metalorganic CVD (MOCVD). Additional non-CVD methods such as molecular beam epitaxy (MBE) are also acceptable.

The second layer can be deposited on the first layer in any manner that maintains the diodic junction characteristics desired for a particular semiconductor cell. This can include chemical vapor deposition (CVD) processes such as atmospheric pressure CVD (APCVD), low pressure CVD (LPCVD), plasma-enhanced CVD (PECVD), photochemical (ultraviolet) (LPCVD), vapor phase epitaxy (VPE), and metalorganic CVD (MOCVD). Additional non-CVD methods such as molecular beam epitaxy (MBE) are also acceptable.

Figure 20:
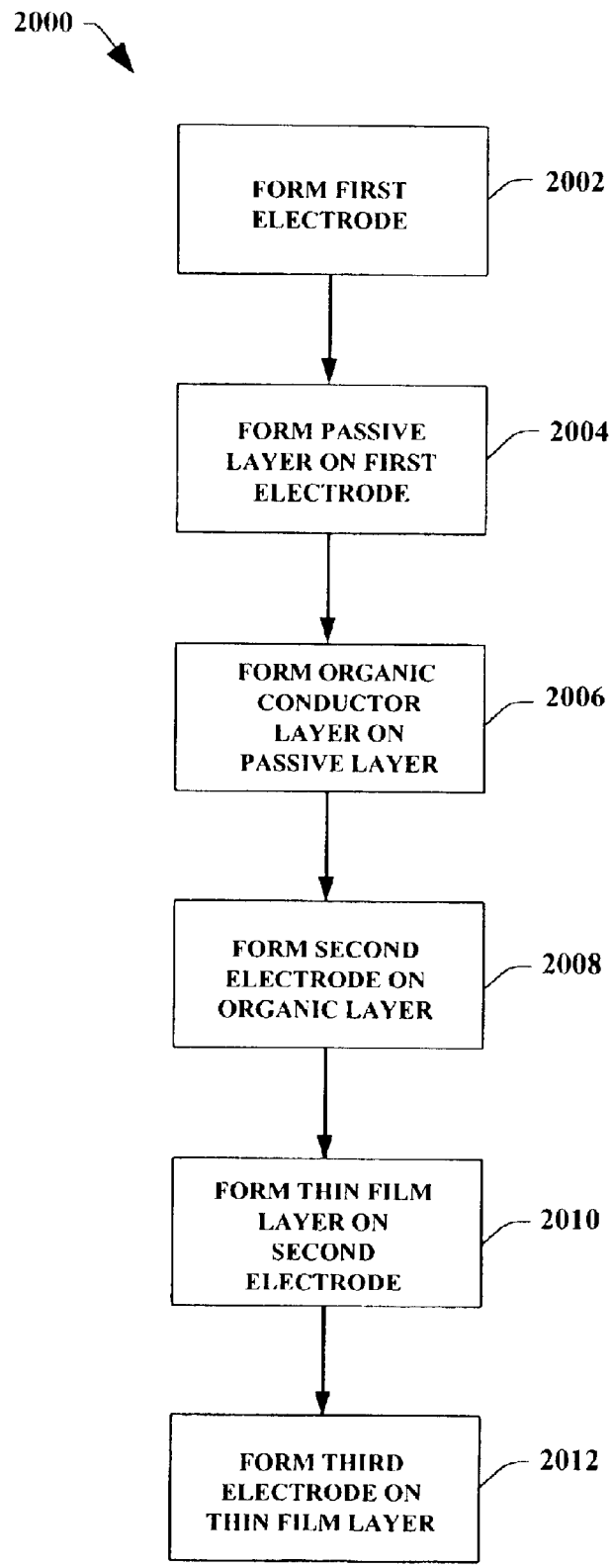
FIG. 20 is a flow diagram illustrating a method of fabricating diodic OSM device in accordance with an aspect of the present invention.

Turning to FIG. 20, a flow diagram-illustrating a method 2000 of fabricating a diodic OSM device in accordance with an aspect of the present invention. The method 2000 depicts one aspect of the present invention. A first electrode is formed on a substrate at 2002. The first electrode is comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys. The thickness of the first electrode can vary depending on the implementation and the memory device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

After forming the first electrode, a passive layer is formed on the first electrode at 2004. The passive layer contains at least one charge carrier assisting material that contributes to the controllable conductive properties of the selectively conductive organic layer. The charge carrier assisting material has the ability to donate and accept charges (holes and/or electrons). Generally, the charge carrier assisting material has at least two relatively stable oxidation-reduction states. The two relatively stable states permit the charge carrier assisting material to donate and accept charges and electrically interact with the organic conductor layer. The particular charge carrier assisting material employed is selected so that the two relatively stable states match with the two relatively stable states of the conjugated organic molecules of the organic conductor layer.

The passive layer can, in some instances, act as a catalyst when forming the organic conductor layer. In this configuration, the backbone of the conjugated organic molecule may initially form adjacent the passive layer, and grow or assemble away and substantially perpendicular to the passive layer surface. As a result, the backbones of the conjugated organic molecules are self-aligned in a direction that traverses the two electrodes.

Examples of charge carrier assisting material that may make up the passive layer include one or more of the following: nickel arsenide (NiAs), cobalt arsenide (CoAs$_2$), copper sulfide (Cu$_2$S, CuS), copper oxide (CuO, Cu$_2$O), manganese oxide (MnO$_2$), titanium dioxide (TiO$_2$), indium oxide (I$_3$O$_4$), silver sulfide (Ag$_2$S, AgS), iron oxide (Fe$_3$O$_4$), and the like. The passive layer is typically grown using oxidation techniques, formed by gas phase reactions, or deposited between the electrodes.

The passive layer has a suitable thickness that can vary according to the implementation and/or memory device being fabricated. Some examples of suitable thicknesses for the passive layer are as follows: a thickness of about 2 Å or more and about 0.1 $\mu$m or less, a thickness of about 10 Å or more and about 0.01 $\mu$m or less, and a thickness of about 50 Å or more and about 0.005 $\mu$m or less.

Next, an organic conductor layer is formed on the passive layer 2006. The organic conductor layer comprises a conjugated molecule(s). Such conjugated molecules are characterized in that they have overlapping $\pi$ orbitals and that they can assume two or more resonant structures. The organic molecules may be cyclic or acyclic. During formation or deposition, the organic molecule self assembles between the electrodes. Examples of conjugated organic materials include one or more of polyacetylene (cis or trans); polyphenylacetylene (cis or trans); polydiphenylacetylene; polyaniline; poly (p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the polymer can be modified by doping with a suitable dopant (e.g., salt).

The organic conductor layer is formed with a suitable thickness that depends upon the chosen implementations and/or the memory device being fabricated. Some suitable exemplary ranges of thickness for the organic conductor layer are about 0.001 µm or more and about 5 µm or less, about 0.01 µm or more and about 2.5 µm or less, and about a thickness of about 0.05 µm or more and about 1 µm or less.

The organic conductor layer can be formed by a number of suitable techniques, some of which are described above. One suitable technique that can be utilized is a spin-on technique that involves depositing a mixture of the polymer/polymer precursor and a solvent, and then removing the solvent from the substrate/electrode. Another technique is chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer.

In order to facilitate operation of the organic memory device, the organic conductor layer is generally substantially thicker than the passive layer. As one example, the thickness of the organic conductor layer is from about 10 to about 500 times greater than the thickness of the passive layer. It is appreciated that other suitable ratios can be employed in accordance with the present invention.

The organic conductor layer and the passive layer are collectively referred to as a selectively conductive organic layer. The conductive properties of this layer (e.g., conductive, non-conductive, semi-conductive) are modified, in a controlled manner, by applying various voltages (e.g., bias voltages) across the layer.

A second electrode is then formed over the organic layer at 2008. The second electrode is formed of a conductive material in a manner similar to that of the first electrode. The second electrode can, but is not required to, be formed of the same conductive material as the first electrode.

Next, a thin film layer is formed on the second electrode 2010. The thin film layer can be deposited on the second electrode in any manner suitable for the type of fabrication being used. This can include chemical vapor deposition (CVD) processes such as atmospheric pressure CVD (APCVD), low pressure CVD (LPCVD), plasma-enhanced CVD (PECVD), photochemical (ultraviolet) (LPCVD), vapor phase epitaxy (VPE), and metalorganic CVD (MOCVD). Additional non-CVD methods such as molecular beam epitaxy (MBE) are also acceptable.

A third electrode is then formed on the thin film layer 2012. The third electrode can be deposited on the thin film layer in any manner that maintains the diodic junction characteristics desired for a particular organic memory cell. This can include chemical vapor deposition (CVD) processes such as atmospheric pressure CVD (APCVD), low pressure CVD (LPCVD), plasma-enhanced CVD (PECVD), photochemical (ultraviolet) (LPCVD), vapor phase epitaxy (VPE), and metalorganic CVD (MOCVD). Additional non-CVD methods such as molecular beam epitaxy (MBE) are also acceptable.

The third electrode is comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys. The thickness of the third electrode can vary depending on the implementation and the OSM device being constructed. However, some exemplary thickness ranges include about 0.01 µm or more and about 10 µm or less, about 0.05 µm or more and about 5 µm or less, and/or about 0.1 µm or more and about 1 µm or less.

Figure 21:
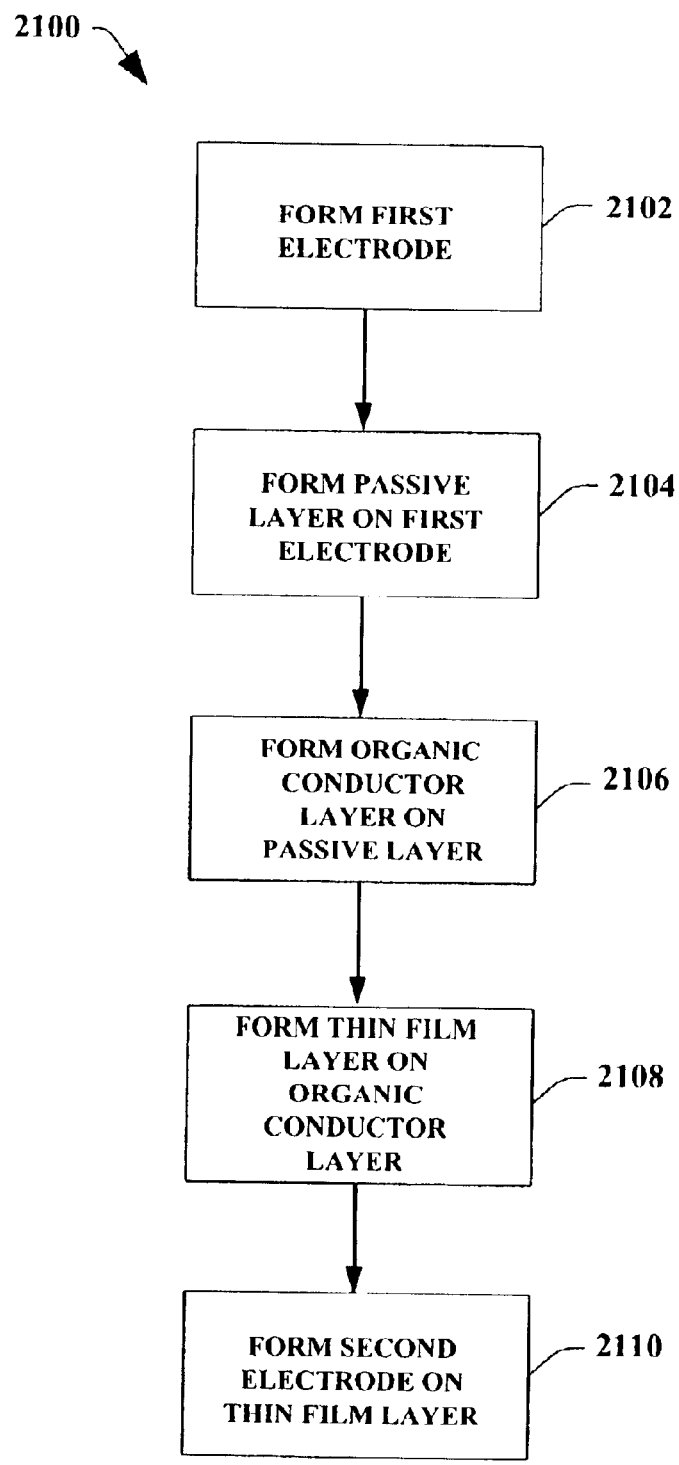
FIG. 21 is a flow diagram illustrating another method of fabricating diodic OSM device in accordance with an aspect of the present invention.

Turning to FIG. 21, a flow diagram illustrating another method 2100 of fabricating a diodic OSM device in accordance with an aspect of the present invention. The method 2100 depicts one aspect of the present invention. A first electrode is formed on a substrate at 2102. The first electrode is comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys. The thickness of the first electrode can vary depending on the implementation and the memory device being constructed. However, some exemplary thickness ranges include about 0.01 µm or more and about 10 µm or less, about 0.05 µm or more and about 5 µm or less, and/or about 0.1 µm or more and about 1 µm or less.

After forming the first electrode, a passive layer is formed on the first electrode at 2104. The passive layer contains at least one charge carrier assisting material that contributes to the controllable conductive properties of the selectively conductive organic layer. The charge carrier assisting material has the ability to donate and accept charges (holes and/or electrons). Generally, the charge carrier assisting material has at least two relatively stable oxidation-reduction states. The two relatively stable states permit the charge carrier assisting material to donate and accept charges and electrically interact with the organic conductor layer. The particular charge carrier assisting material employed is selected so that the two relatively stable states match with the two relatively stable states of the conjugated organic molecules of the organic conductor layer.

The passive layer can, in some instances, act as a catalyst when forming the organic conductor layer. In this configuration, the backbone of the conjugated organic molecule may initially form adjacent the passive layer, and grow or assemble away and substantially perpendicular to the passive layer surface. As a result, the backbones of the conjugated organic molecules are self-aligned in a direction perpendicular to the first electrode.

Examples of charge carrier assisting material that may make up the passive layer include one or more of the following: nickel arsenide (NiAs), cobalt arsenide (CoAs$_2$), copper sulfide (Cu$_2$S, CuS), copper oxide (CuO, Cu$_2$O), manganese oxide (MnO$_2$), titanium dioxide (TiO$_2$), indium oxide (I$_3$O$_4$), silver sulfide (Ag$_2$S, AgS), iron oxide (Fe$_3$O$_4$), and the like. The passive layer is typically grown using oxidation techniques, formed by gas phase reactions, or deposited on the first electrode.

The passive layer has a suitable thickness that can vary according to the implementation and/or memory device being fabricated. Some examples of suitable thicknesses for the passive layer are as follows: a thickness of about 2 Å or more and about 0.1 µm or less, a thickness of about 10 Å or more and about 0.01 µm or less, and a thickness of about 50 Å or more and about 0.005 µm or less.

Next, an organic conductor layer is formed on the passive layer 2106. The organic conductor layer comprises a conjugated molecule(s). Such conjugated molecules are characterized in that they have overlapping $\pi$ orbitals and that they can assume two or more resonant structures. The organic molecules may be cyclic or acyclic. During formation or deposition, the organic molecule self assembles. Examples of conjugated organic materials include one or more of polyacetylene (cis or trans); polyphenylacetylene (cis or trans); polydiphenylacetylene; polyaniline; poly (p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the polymer can be modified by doping with a suitable dopant (e.g., salt).

The organic conductor layer is formed with a suitable thickness that depends upon the chosen implementations and/or the memory device being fabricated. Some suitable exemplary ranges of thickness for the organic conductor layer are about 0.001 $\mu$m or more and about 5 $\mu$m or less, about 0.01 $\mu$m or more and about 2.5 $\mu$m or less, and about a thickness of about 0.05 $\mu$m or more and about 1 $\mu$m or less.

The organic conductor layer can be formed by a number of suitable techniques, some of which are described above. One suitable technique that can be utilized is a spin-on technique that involves depositing a mixture of the polymer/polymer precursor and a solvent, and then removing the solvent from the substrate/electrode. Another technique is chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer.

In order to facilitate operation of the organic memory device, the organic conductor layer is generally substantially thicker than the passive layer. As one example, the thickness of the organic conductor layer is from about 10 to about 500 times greater than the thickness of the passive layer. It is appreciated that other suitable ratios can be employed in accordance with the present invention.

The organic conductor layer and the passive layer are collectively referred to as a selectively conductive organic layer. The conductive properties of this layer (e.g., conductive, non-conductive, semi-conductive) are modified, in a controlled manner, by applying various voltages (e.g., bias voltages) across the layer.

Next, a thin film layer is formed on the organic conductor layer 2108. The thin film layer can be deposited on the organic conductor layer in any manner suitable for the type of fabrication being used. This can include chemical vapor deposition (CVD) processes such as atmospheric pressure CVD (APCVD), low pressure CVD (LPCVD), plasma-enhanced CVD (PECVD), photochemical (ultraviolet) (LPCVD), vapor phase epitaxy (VPE), and metalorganic CVD (MOCVD). Additional non-CVD methods such as molecular beam epitaxy (MBE) are also acceptable.

A second electrode is then formed on the thin film layer 2110. The second electrode can be deposited on the thin film layer in any manner that maintains the diodic junction characteristics desired for a particular organic memory cell. This can include chemical vapor deposition (CVD) processes such as atmospheric pressure CVD (APCVD), low pressure CVD (LPCVD), plasma-enhanced CVD (PECVD), photochemical (ultraviolet) (LPCVD), vapor phase epitaxy (VPE), and metalorganic CVD (MOCVD). Additional non-CVD methods such as molecular beam epitaxy (MBE) are also acceptable.

The second electrode is comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys. The thickness of the second electrode can vary depending on the implementation and the OSM device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

What has been described above is one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description or the claims, such term is intended to be inclusive in a manner similar to the term "comprising."

What is claimed is:

1. A memory cell array comprising a plurality of addressable memory cell devices that have diodic characteristics which enable self-regulation of internal current flow for programming, erasing and reading purposes, wherein a diodic layer is coupled to at least one memory cell, and wherein the diodic layer exhibits zener-type diodic properties with a forward voltage level sufficient to cause the memory cell to operate and a breakdown voltage level sufficient to cause the memory cell to erase.

2. The memory cell array of claim 1, the diodic characteristics resemble a zener-type diode oriented in a forward direction from a bitline to a wordline.

3. The memory cell array of claim 1, the diodic characteristics resemble a zoner-type diode oriented in a forward direction from a wordline to a bitline.

4. The memory cell array of claim 1, the diodic characteristics include a resistive loading element that is employed to program an addressable memory cell device.

5. A semiconductor device comprising:
   at least one memory cell; and
   a diodic layer coupled to the at least one memory cell, wherein the diodic layer has electrical characteristics approximately defined by: $|V_{ERASE}|>|V_{PROG}|>|V_{READ}|$ (A).

6. The device of claim 5, the electrical characteristics further approximately defined by:

$$|V_{REVERSE\ BREAKDOWN}|>|V_{FORWARD\ TURN\ ON}| \quad (B).$$

7. The device of claim 5, the diodic layer providing a resistive loading element employed to program the memory cell.

8. The device of claim 5, the memory cell comprising an organic light emitting diode (OLED).

9. The device of claim 5, the memory cell comprising a EEPROM cell.

10. The semiconductor device of claim 5, employed in a handheld electronic device.

11. The device of claim 5, the memory cell comprising an organic memory cell.

12. The device of claim 11, the organic memory cell comprising first and second electrodes, and a selectively conductive organic semiconductor layer interposed between the first and second electrodes.

13. The device of claim 12, the first electrode comprising a material composed of at least one of copper and aluminum.

14. The device of claim 12, the second electrode comprising a material composed of at least one of copper and aluminum.

15. The device of claim 12, the diodic layer comprising a third electrode and a thin film layer interposed between the second electrode and the third electrode.

16. The device of claim 11, the organic memory cell comprising a first electrode coupled to a selectively conductive organic semiconductor layer.

17. The device of claim 16, the selectively conductive organic semiconductor layer comprising a passive layer and an organic conductor layer.

18. The device of claim 17, the diodic layer comprising a second electrode and a thin film layer, interposed between the selectively conductive organic layer and the second electrode.

19. A semiconductor device comprising:

at least one memory cell; and a diodic layer coupled to the at least one memory cell, wherein the diodic layer has zener-type diodic properties with a forward voltage level sufficient to cause the memory cell to operate and a breakdown voltage level that causes the memory cell to erase.

20. The device of claim 19, the zener-type diodic properties minimize leakage of current across the semiconductor cell when a reverse voltage level is less than the breakdown voltage level.

21. The device of claim 19, the diodic layer comprising a first layer coupled to the memory cell and a second layer coupled to the first layer.

22. The device of claim 21, the first and second layers form a junction comprising at least one of a silicon based p-n junction, an organic-organic semiconductor junction, an organic semiconductor-metal junction, an organic semiconductor-silicon based p-type material junction, and an organic semiconductor-silicon based n-type material junction.

23. The device of claim 21, the first layer comprising a polysilicon material.

24. The device of claim 21, the first layer comprising a material composed of organic and inorganic conducting material.

25. The device of claim 21, the first layer comprising a semiconductor material in an amorphous state.

26. The device of claim 21, the first layer comprising a semiconductor material in a crystal state.

27. The device of claim 21, the first layer comprising a thin film layer.

28. The device of claim 21, the first layer comprising a multi-thin film layer.

29. The device of claim 21, the second layer comprising a material composed of at least one of copper and aluminum.

30. A semiconductor device comprising:

at least one memory cell; and a diodic layer coupled to the at least one memory cell, wherein the diodic layer has Schottky-type diodic properties with a forward voltage level sufficient to cause the memory cell to operate and a breakdown voltage level sufficient to cause erasure of the memory cell.

31. A method of fabricating a semiconductor device comprising:

forming a first layer on a memory cell; and forming a second layer on the first layer to create a diodic junction with the first layer, wherein the diodic junction has zener-type properties with a forward voltage level sufficient to cause the memory cell to operate and a selectable breakdown voltage level sufficient to cause the memory cell to erase.

32. The method of claim 31, wherein formation of the first layer comprises a thin film formation process.

33. The method of claim 31, wherein formation of the first layer comprises a multi-thin film formation process.

34. The method of claim 31, wherein the second layer forms the top electrode of the semiconductor device.

35. The method of claim 31, further comprising:

forming a first electrode;

forming a selectively conductive organic layer on the first electrode; and forming a second electrode on the selectively conductive layer, providing an electrode for the memory cell.

36. A method of fabricating an organic semiconductor device comprising:

forming a first electrode of an organic memory cell;

forming a passive layer on the first electrode;

forming an organic conductor layer on the passive layer; and forming a diodic layer that has zener-type properties on the organic conductor layer.

37. The method of claim 36, the diodic layer comprising a first layer formed on the organic conductor layer and a second electrode formed on the first layer.

38. A computer comprising the semiconductor device of claim 5.

39. An array comprising a plurality of the semiconductor device of claim 5 employed in a memory device.

40. A semiconductor device comprising:

at least one memory cell; and a diodic layer coupled to at least one memory cell, wherein the diodic layer has electrical characteristics approximately defined by:

$$|V_{PROG}|>|V_{ERASE}|>|V_{READ}| \tag{C}$$

* * * * *